(12) United States Patent
Choi

(10) Patent No.: US 11,200,921 B2
(45) Date of Patent: Dec. 14, 2021

(54) MEMORY DEVICE AND METHOD OF OPERATING THE SAME

(71) Applicant: SK hynix Inc., Gyeonggi-do (KR)

(72) Inventor: Hyung Jin Choi, Ulsan (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/883,410

(22) Filed: May 26, 2020

(65) Prior Publication Data

US 2021/0174843 A1    Jun. 10, 2021

(30) Foreign Application Priority Data

Dec. 4, 2019   (KR) .................. 10-2019-0160174

(51) Int. Cl.
| | | |
|---|---|---|
| *G11C 16/06* | (2006.01) | |
| *G11C 7/06* | (2006.01) | |
| *G11C 7/10* | (2006.01) | |
| *G11C 16/34* | (2006.01) | |
| *G11C 16/10* | (2006.01) | |
| *G11C 16/24* | (2006.01) | |
| *G11C 16/08* | (2006.01) | |

(52) U.S. Cl.
CPC ............ *G11C 7/065* (2013.01); *G11C 7/1048* (2013.01); *G11C 7/1084* (2013.01); *G11C 16/08* (2013.01); *G11C 16/10* (2013.01); *G11C 16/24* (2013.01); *G11C 16/3436* (2013.01)

(58) Field of Classification Search
CPC ..... G11C 7/065; G11C 7/1048; G11C 7/1084; G11C 16/08; G11C 16/10; G11C 16/24
See application file for complete search history.

(56) References Cited

U.S. PATENT DOCUMENTS

| | | | | |
|---|---|---|---|---|
| 5,969,985 | A  * | 10/1999 | Tanaka ................. | G11C 7/1006 365/185.03 |
| 2018/0068733 | A1 * | 3/2018 | Lee ..................... | G11C 16/3459 |
| 2019/0115081 | A1 * | 4/2019 | Lee ..................... | G11C 16/3468 |
| 2019/0156904 | A1 * | 5/2019 | Hong ..................... | G11C 16/16 |
| 2019/0237145 | A1 * | 8/2019 | Jo ......................... | G11C 16/26 |

FOREIGN PATENT DOCUMENTS

| | | |
|---|---|---|
| KR | 10-2009-0077318 | 7/2009 |
| KR | 10-2016-0029215 | 3/2016 |

* cited by examiner

*Primary Examiner* — Tuan T Nguyen
(74) *Attorney, Agent, or Firm* — IP & T Group LLP

(57) ABSTRACT

The present disclosure relates to an electronic device. A memory device having improved cache program operation performance according to the present technology includes a plurality of memory cells, each programmed in any one of first to n-th program state where n is a natural number greater than, a sensing latch configured to store data sensed from a bit line connected to a selected memory cell among the plurality of memory cells, and a plurality of data latches configured to temporarily store data to be stored in the selected memory cell.

20 Claims, 17 Drawing Sheets

FIG. 13
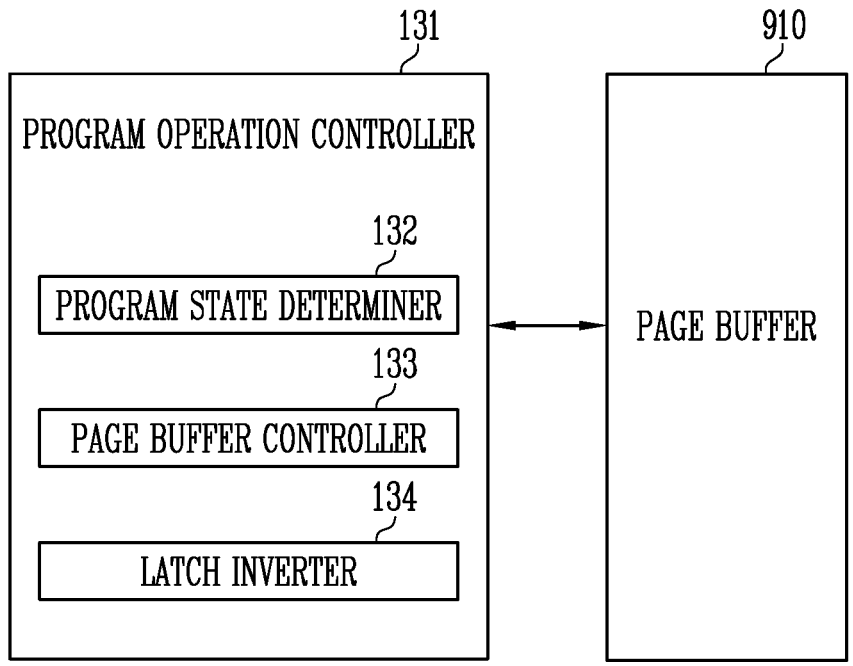
FIG. 14A
INFORMATION STORED IN LATCHES AFTER P6 VERIFY PASS
| FIRST LATCH | SECOND LATCH | THIRD LATCH | FOURTH LATCH |
|---|---|---|---|
| SENSING INFORMATION | N+1 LSB | VERIFY INFORMATION | N+1 CSB |
FIG. 14B
DATA MOVEMENT BETWEEN LATCHES ACCORDING TO EMBODIMENT
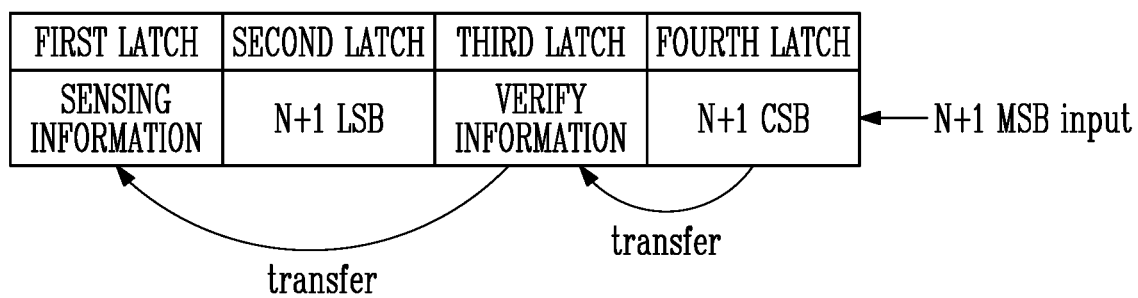

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0160174, filed on Dec. 4, 2019, which is incorporated herein by reference in its entirety.

BACKGROUND

Field of Invention

The present disclosure relates to an electronic device, and more particularly, to a memory device and a method of operating the same.

Description of Related Art

A storage device stores data under control of a host device such as a computer or a smartphone. A storage device may include a memory device in which data is stored and a memory controller controlling the memory device, which may be a volatile memory device or a non-volatile memory device.

A volatile memory device stores data only when power is supplied and loses the stored data when the power supply is cut off. Examples of volatile memory devices include a static random access memory (SRAM), a dynamic random access memory (DRAM), and the like.

A non-volatile memory device does not lose data even though power is cut off. Examples of non-volatile memory devices include a read only memory (ROM), a programmable ROM (PROM), an electrically programmable ROM (EPROM), an electrically erasable and programmable ROM (EEPROM), a flash memory, and the like.

SUMMARY

An embodiment of the present disclosure provides a memory device having improved cache program operation performance and a method of operating the same.

A memory device according to an embodiment of the present disclosure includes a plurality of memory cells, each programmed in any one of first to n-th program states, where n is a natural number greater than 1, a sensing latch configured to store data sensed from a bit line connected to a selected memory cell among the plurality of memory cells, and a plurality of data latches configured to temporarily store data to be stored in the selected memory cell. Any one data latch among the plurality of data latches stores result information for a verify operation of the first to n-th program states until a verify operation for a set program state of the first to n-th program states passes, and the sensing latch stores the result information for the verify operation after the verify operation for the set program state passes.

A memory device according to an embodiment of the present disclosure includes a plurality of memory cells, each programmed in any one of first to n-th program states, where n is a natural number greater than 1, a sensing latch configured to store sensing data sensed from a bit line connected to a selected memory cell, data latches configured to temporarily store program data to be stored in the selected memory cell among the plurality of memory cells, and control logic configured to store result information for a verify operation of the first to set program states in any one data latch among the data latches, and store result information for a verify operation performed after the verify operation for the set program state passes in the sensing latch, until a verify operation for the critical program state of the first to n-th program states passes.

A method of operating a memory device according to an embodiment of the present disclosure includes storing result information for a verify operation of first to n-th program states in any one data latch among a plurality of data latches, determining whether a verify operation for a set program state among the first to n-th program states passes, and storing the result information for the verify operation after the verify operation for the set program state passes in a sensing latch based on the determination result.

A method of operating a memory device according to an embodiment of the present disclosure includes latching, in a third of first to fourth latches, a verify result of first to (n−1)-th program states of first to n-th program states for a selected memory cell, latching, in the second and fourth latches, first and second data to be stored in a subsequent memory cell relative to the selected memory cell, moving, when the selected memory cell is in the (n−1)-th program state, the verify result from the third latch to the first latch while moving the second data from the fourth latch to the third latch, latching, in the fourth latch, third data to be stored in the subsequent memory cell, and programming, when the selected memory cell is in the n-th program state, the latched first to third data in the subsequent memory cell.

The memory device and the method of operating the same according to the present technology provide improved cache program operation performance.

BRIEF DESCRIPTION OF THE DRAWINGS

FIG. 13 is a diagram illustrating a program operation controller.

FIGS. 14A and 14B are diagrams for describing data movement between latches according to an embodiment of the present disclosure.

DETAILED DESCRIPTION

Specific structural and functional detail of various features and aspects of the invention is provided to describe embodiments of the present disclosure. However, the invention may be implemented or carried out in various forms and thus the invention is not limited to any of the disclosed embodiments nor to any specific details provided herein. Also, throughout the specification, reference to "an embodiment," "another embodiment" or the like is not necessarily to only one embodiment, and different references to any such phrase are not necessarily to the same embodiment(s).

Embodiments of the present disclosure are described below with reference to the accompanying drawings to enable those skilled in the art to practice the invention.

Figure 1:
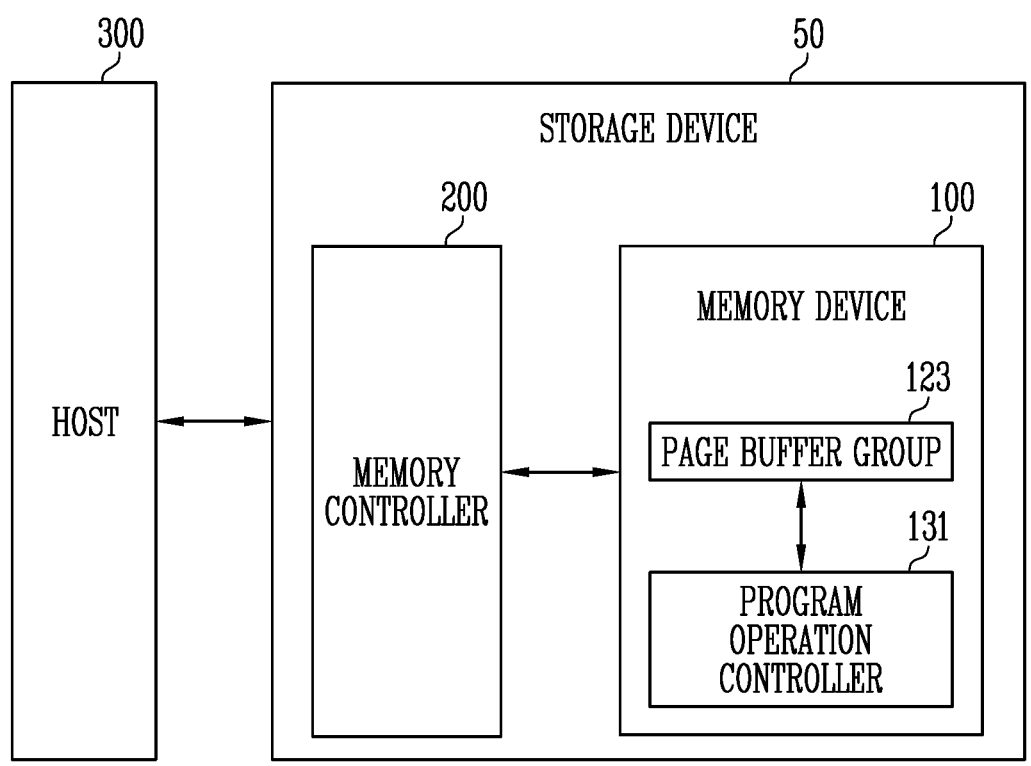
FIG. 1 is a block diagram illustrating a storage device.

FIG. 1 is a block diagram illustrating a storage device.

Referring to FIG. 1, the storage device 50 may include a memory device 100 and a memory controller 200 that controls an operation of the memory device.

The storage device 50 may store data under control of a host 300 such as a cellular phone, a smartphone, an MP3 player, a laptop computer, a desktop computer, a game player, a TV, a tablet PC, or an in-vehicle infotainment system.

The storage device 50 may be any of various types of storage devices according to a host interface that defines communication with the host 300. For example, the storage device 50 may be configured as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and/or a memory stick.

The storage device 50 may be manufactured as any of various types of packages. For example, the storage device 50 may be manufactured as a package on package (POP), a system in package (SIP), a system on chip (SOC), a multi-chip package (MCP), a chip on board (COB), a wafer-level fabricated package (WFP), and/or a wafer-level stack package (WSP).

The memory device 100 may store data. The memory device 100 operates under control of the memory controller 200. The memory device 100 may include a plurality of memory dies. Each of the plurality of memory dies may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, aspects and features of the invention are described in the context in which the memory device 100 is a NAND flash memory.

The memory device 100 may receive a command and an address from the memory controller 200. The memory device 100 is configured to access an area selected by the received address of the memory cell array. Accessing the selected area means performing an operation corresponding to the received command on the selected area. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory device 100 may include a plurality of memory dies. Each memory die may include at least one memory cell array. The plurality of memory dies may be controlled through a die interleaving operation, a channel interleaving operation, a way interleaving operation, or a plane interleaving operation.

In an embodiment of the present disclosure, the memory device 100 may include a page buffer group 123 and a program operation controller 131.

The page buffer group 123 may temporarily store program data to be programmed in a memory cell in the memory device 100, store pre-charge data that determines a potential to which a bit line connected to the memory cell is to be pre-charged, or store data sensed from the memory cell. The page buffer group 123 may temporarily store data to be programmed in a next page for a cache program operation. Specifically, while data is programmed in a current page, data to be programmed in the next page may be temporarily stored. The current page may be memory cells connected to a currently selected word line. The next page may be memory cells connected to a subsequently selected word line.

The program operation controller 131 may control the page buffer group 123 and a peripheral circuit (not shown) so that the data temporarily stored in the page buffer group 123 is programmed in the memory device 100.

The program operation controller 131 may check a program state of the memory cells connected to the selected word line, and control the peripheral circuit (not shown) to input data to be stored in the memory cells connected to the word line to be next selected to the page buffer group 123 according to the program state.

When power is applied to the storage device 50, the memory controller 200 may execute firmware (FW). The firmware FW may include a host interface layer HIL that receives the request input from the host 300 or outputs a response to the host 300, a flash translation layer (FTL) that manages an operation between an interface of the host 300 and an interface of the memory device 100, and a flash interface layer (FIL) that provides a command to the memory device 100 or receives the response from the memory device 100.

The memory controller 200 may receive data and a logical address (LA) from the host 300, and may convert the logical address into a physical address (PA) indicating an address of memory cells in which data included in the memory device 100 in which data is to be stored. The LA may be a logical block address (LBA), and the PA may be a physical block address (PBA).

The memory controller 200 may control the memory device 100 to perform the program operation, the read operation, or the erase operation according to the request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

The memory controller 200 may control the memory device 100 to perform the program operation, the read operation, or the erase operation by itself in the absence of a request from the host 300. For example, the memory controller 200 may control the memory device 100 to perform the program operation, the read operation, or the erase operation used to perform a background operation such as wear leveling, garbage collection, or read reclaim.

The memory controller 200 may provide a cache program command to the memory device 100. When the memory device 100 receives the cache program command, the program operation controller 131 may control page buffer group 123 to store data to be programmed in a next page in the page buffer group 123 while data is programmed in the current page.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

Figure 2:
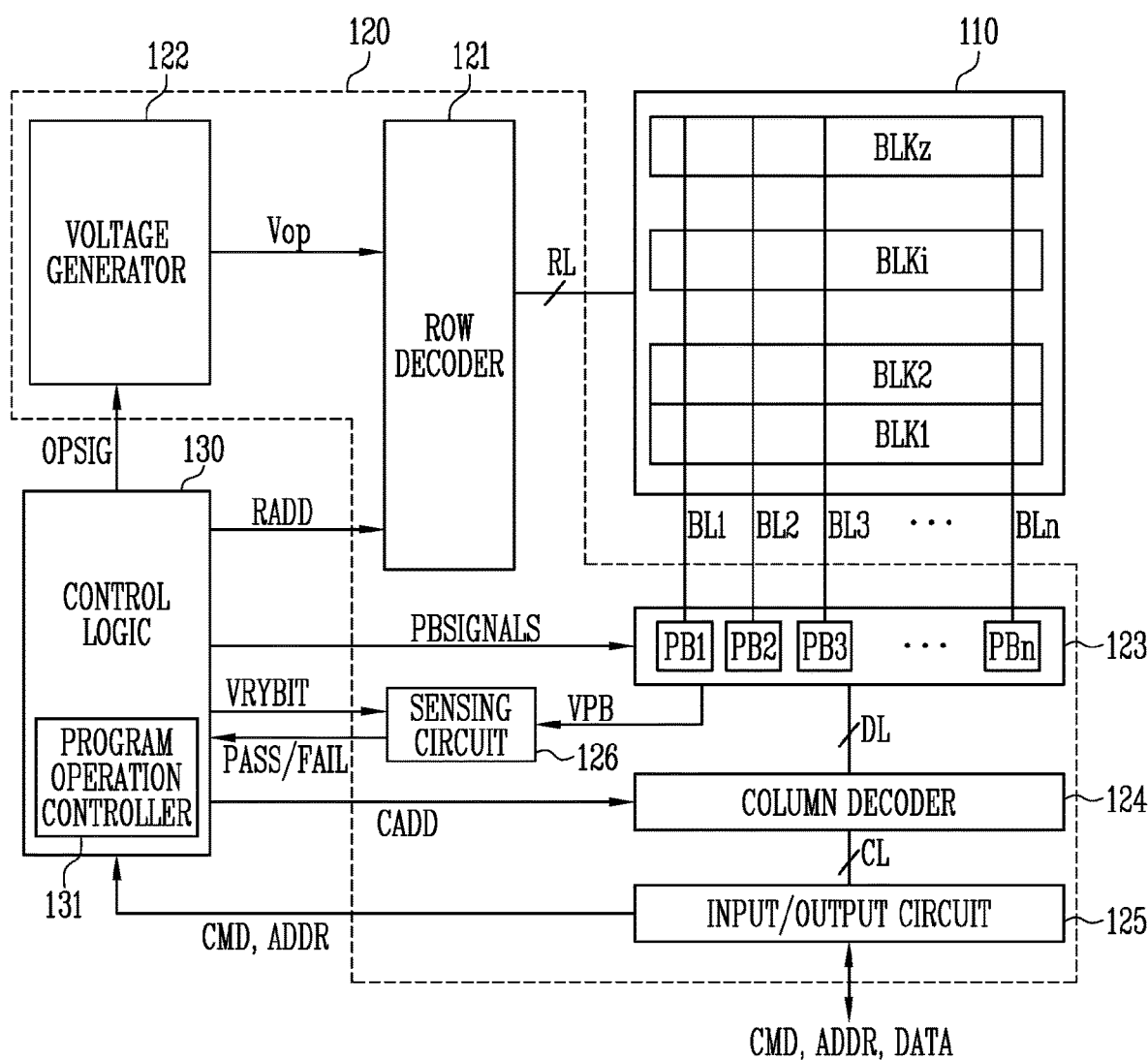
FIG. 2 is a diagram illustrating a memory device according to an embodiment of the present disclosure.

FIG. 2 is a diagram illustrating the memory device 100 according to an embodiment of the present disclosure.

Referring to FIG. 2, the memory die may include a memory cell array 110, a peripheral circuit 120, and control logic 130.

The memory cell array 110 includes a plurality of memory blocks BLK1 to BLKz, which are connected to a row decoder 121 through row lines RL. The memory blocks BLK1 to BLKz may be connected to a page buffer group 123 through bit lines BL1 to BLn. Each of the plurality of memory blocks BLK1 to BLKz includes a plurality of memory cells. In an embodiment, the plurality of memory cells are non-volatile memory cells. Memory cells connected to the same word line may be defined as one page. Thus, one memory block may include a plurality of pages.

The row lines RL may include at least one source select line, a plurality of word lines, and at least one drain select line.

Each of the memory cells in the memory cell array 110 may be configured as a single level cell (SLC) storing one data bit, a multi-level cell (MLC) storing two data bits, a triple level cell (TLC) storing three data bits, or a quad level cell (QLC) storing four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to the control of the control logic 130. The row decoder 121 receives a row address RADD from the control logic 130.

The row decoder 121 is configured to decode the row address RADD. The row decoder 121 selects at least one memory block among the memory blocks BLK1 to BLKz according to a decoded address. In addition, the row decoder 121 may select at least one word line of the memory block selected according to the decoded address to apply voltages generated by the voltage generator 122 to the at least one word line WL.

For example, during the program operation, the row decoder 121 may apply a program voltage to a selected word line and apply a program pass voltage lower than the program voltage to unselected word lines. During a program verify operation, the row decoder 121 may apply a verify voltage to the selected word line and apply a verify pass voltage higher than the verify voltage to the unselected word lines. During the read operation, the row decoder 121 may apply a read voltage to the selected word line and apply a read pass voltage higher than the read voltage to the unselected word lines.

In an embodiment, the erase operation of the memory cell array 110 is performed in a memory block unit. During the erase operation, the row decoder 121 may select one memory block according to the decoded address. During the erase operation, the row decoder 121 may apply a ground voltage to word lines connected to the selected memory block.

The voltage generator 122 operates in response to the control of the control logic 130. The voltage generator 122 is configured to generate a plurality of voltages using an external power voltage supplied to the memory device. Specifically, the voltage generator 122 may generate various operation voltages Vop used in the program, read, and erase operations in response to operation signal OPSIG. For example, the voltage generator 122 may generate a program voltage, a verify voltage, a pass voltage, a read voltage, an erase voltage, and the like in response to the control of the control logic 130.

In an embodiment, the voltage generator 122 may generate an internal power voltage by regulating an external power voltage. The internal power voltage generated by the voltage generator 122 is used as an operation voltage of the memory cell array 110.

In an embodiment, the voltage generator 122 may generate a plurality of voltages using an external power voltage or an internal power voltage.

For example, the voltage generator 122 may include a plurality of pumping capacitors that receive the internal power voltage, and selectively activate the plurality of pumping capacitors in response to the control of the control logic 130 to generate the plurality of voltages.

The generated plurality of voltages may be supplied to the memory cell array 110 by the row decoder 121.

The buffer group 123 includes first to n-th page buffers PB1 to PBn, which are connected to the memory cell array 110 through the first to n-th bit lines BL1 to BLn, respectively. The first to n-th page buffers PB1 to PBn operate under the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when a program pulse is applied to the selected word line, the first to n-th page buffers PB1 to PBn may transfer data DATA, which is received through the data input/output circuit 125, to selected memory cells through the first to n-th bit lines BL1 to BLn. The memory cells of the selected page are programmed according to the transferred data DATA. A memory cell connected to a bit line to which a program permission voltage (for example, the ground voltage) is applied may have an increased threshold voltage. A threshold voltage of a memory cell connected to a bit line to which a program inhibit voltage (for example, the power voltage) is applied may be maintained. During the program verify operation, the first to n-th page buffers PB1 to PBn read page data from the selected memory cells through the first to n-th bit lines BL1 to BLn.

During the read operation, the first to n-th page buffers PB1 to PBn read the data DATA from the memory cells of a selected page through the first to n-th bit lines BL1 to BLn, and outputs the read data DATA to the data input/output circuit 125 under control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to the column address CADD. For example, the column decoder 124 may exchange data with the first to n-th page buffers PB1 to PBn through data lines DL or may exchange data with the input/output circuit 125 through column lines CL.

The input/output circuit 125 may transfer the command CMD and the address ADDR received from the memory controller 200 described with reference to FIG. 1 to the control logic 130, or may exchange the data DATA with the column decoder 124.

The sensing circuit 126 may generate a reference current in response to a permission bit signal VRYBIT during the read operation or the verify operation, and may compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. In addition, the control logic 130 may determine whether the verify operation passed or failed in response to the pass or fail signal PASS or FAIL. In an embodiment according to the present disclosure, the pass or fail signal PASS or FAIL, that is, verify information, may be temporarily stored in the page buffer group 123. The program operation controller 131 may perform the program operation based on the verify information. In an embodiment, the program operation controller 131 may determine the program state of the memory cell in response to the pass or fail signal PASS or FAIL. For example, when the memory cell operates as a triple level cell (TLC), the program operation controller 131 may determine whether the program state of the memory cell is any one of an erase state E or first to seventh program states P1 to P7.

Figure 3:
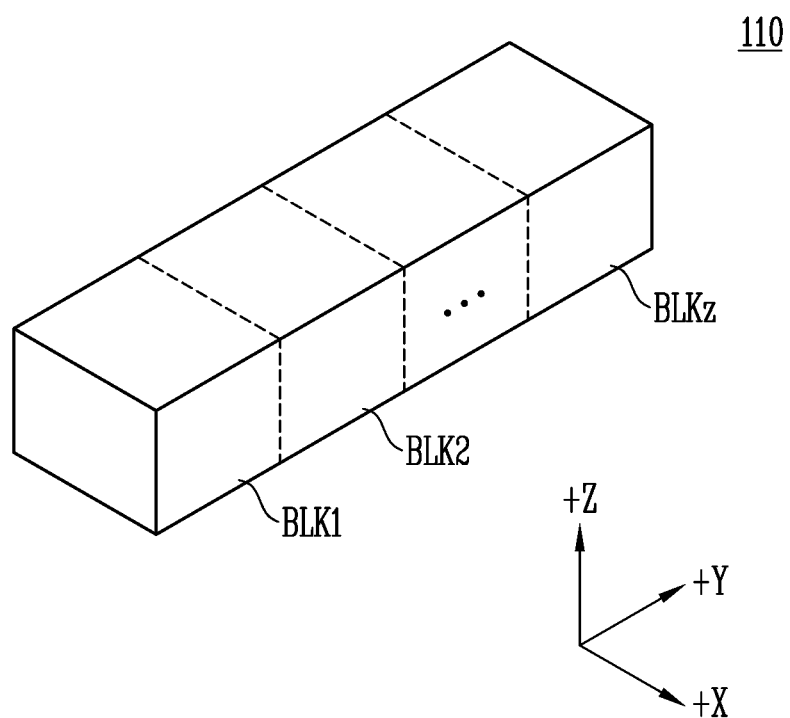
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block has a three-dimensional structure. Each memory block includes a plurality of memory cells stacked on a substrate. The plurality of memory cells are arranged along mutually orthogonal directions, i.e., a +X direction, a +Y direction, and a +Z direction. A structure of each memory block is described in more detail with reference to FIGS. 4 to 6.

Figure 4:
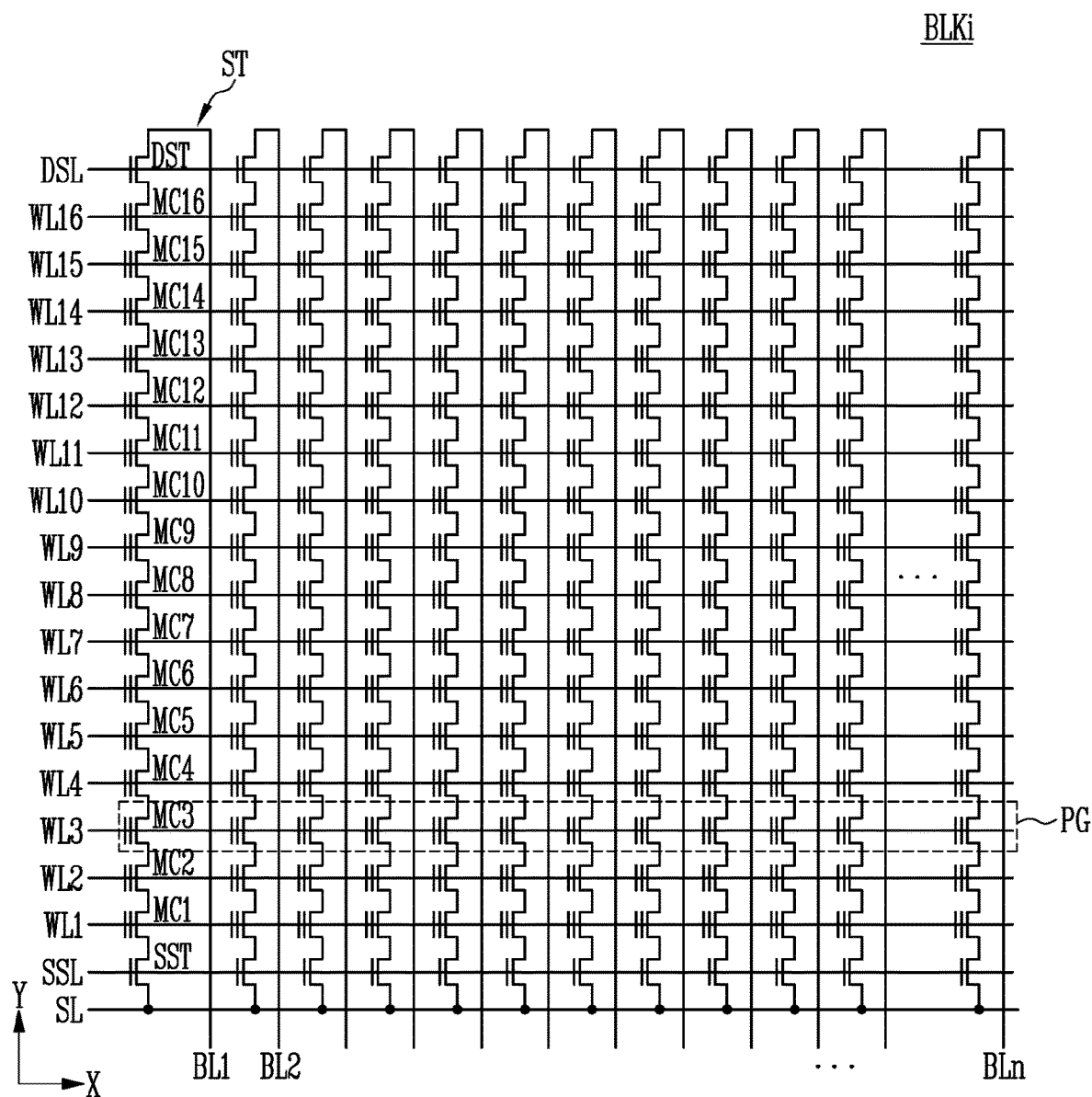
FIG. 4 is a diagram illustrating a memory block BLKi of FIG. 3.

FIG. 4 is a diagram for describing a memory block BLKi of FIG. 3.

Referring to FIG. 4, a plurality of word lines arranged in parallel to each other between a first select line and a second select line may be connected to the memory block BLKi. Here, the first select line may be a source select line SSL, and the second select line may be a drain select line DSL. More specifically, the memory block BLKi may include a plurality of strings ST connected between the bit lines BL1 to BLn and a source line SL. The bit lines BL1 to BLn may be connected to the strings ST, respectively, and the source line SL may be commonly connected to the strings ST. Since the strings ST may be configured identically to each other, the string ST connected to the first bit line BL1 will be specifically described as an example.

The string ST may include a source select transistor SST, a plurality of memory cells MC1 to MC16, and a drain select transistor DST connected in series between the source line SL and the first bit line BL1. One string ST may include at least one source select transistor SST and at least one drain select transistor DST, and may include more than the 16 memory cells MC1 to MC16 shown in the drawing.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of the source select transistors SST included in different strings ST may be connected to the source select line SSL, gates of the drain select transistors DST may be connected to the drain select line DSL, and gates of the memory cells MC1 to MC16 may be connected to a plurality of word lines WL1 to WL16. A group of memory cells connected to the same word line among memory cells included in different strings ST may be referred to as a physical page PG. Therefore, the memory block BLKi may include as many physical pages PG as the number of word lines WL1 to WL16.

One memory cell may store 1 bit of data. This is commonly called a single level cell (SLC). In this case, one physical page PG may store one logical page (LPG) data. The one logical page (LPG) data may include as many data bits as the number of cells included in one physical page (PG).

In addition, one memory cell may store two or more bits of data. In this case, one physical page (PG) may store two or more logical page (LPG) data.

Figure 5:
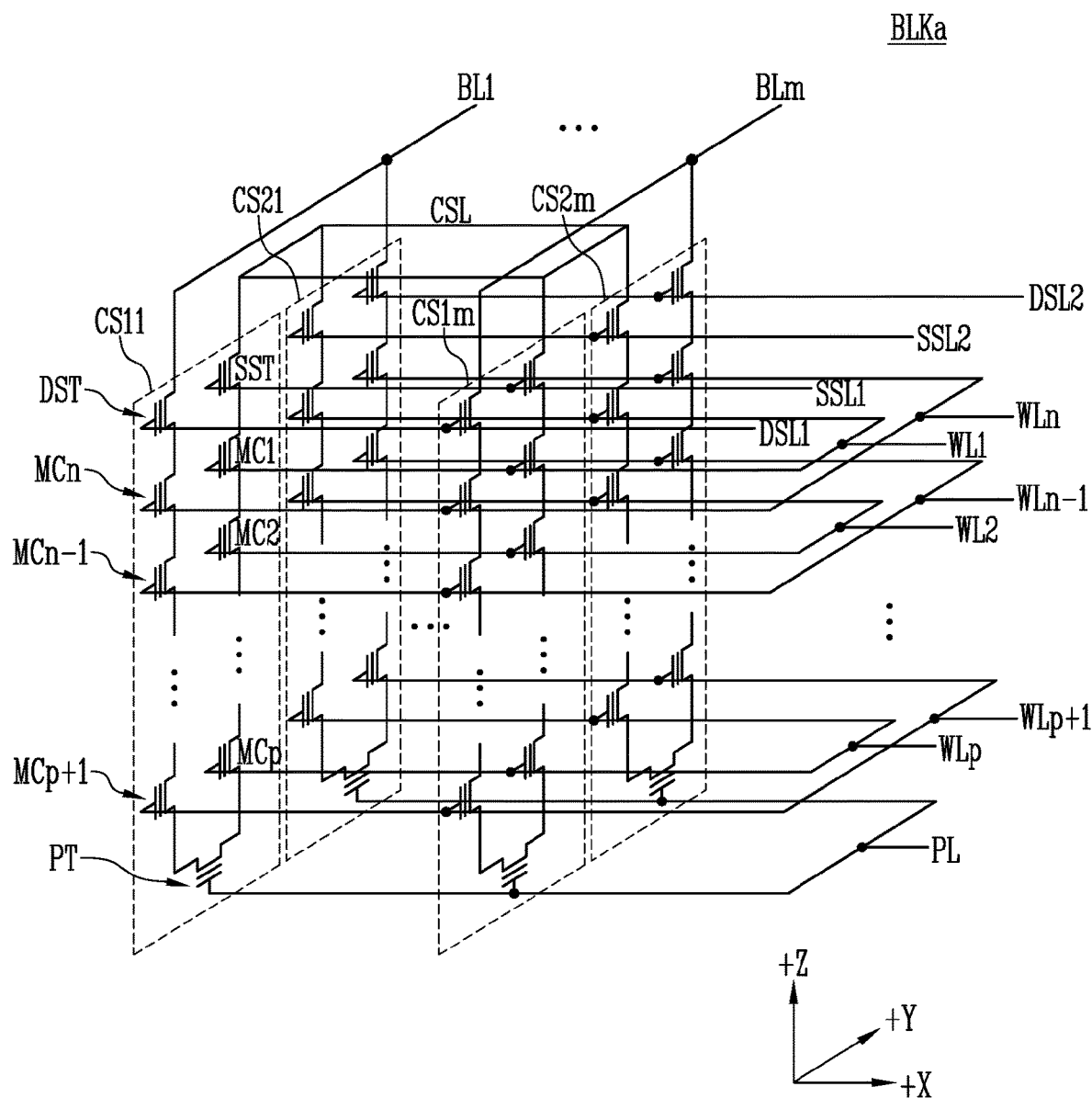
FIG. 5 is a circuit diagram illustrating a representative memory block BLKa among memory blocks BLK1 to BLKz of FIG. 3.

FIG. 5 is a circuit diagram illustrating a representative memory block BLKa among the memory blocks BLK1 to BLKz of

FIG. 3.

Referring to FIG. 5, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (that is, the +X direction). In FIG. 5, two cell strings are arranged in a column direction (that is, the +Y direction). However, this is for clarity; three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 5, the source select transistors of the cell strings CS11 to CS1m of a first row are connected to a first source select line SSL1. The source select transistors of the cell strings CS21 to CS2m of a second row are connected to a second source select line SSL2.

In another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a −Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, and odd-numbered cell strings among the cell strings CS11 to CS1m or CS21 to CS2m arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control the dummy memory cell(s), each dummy memory cell may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 6:
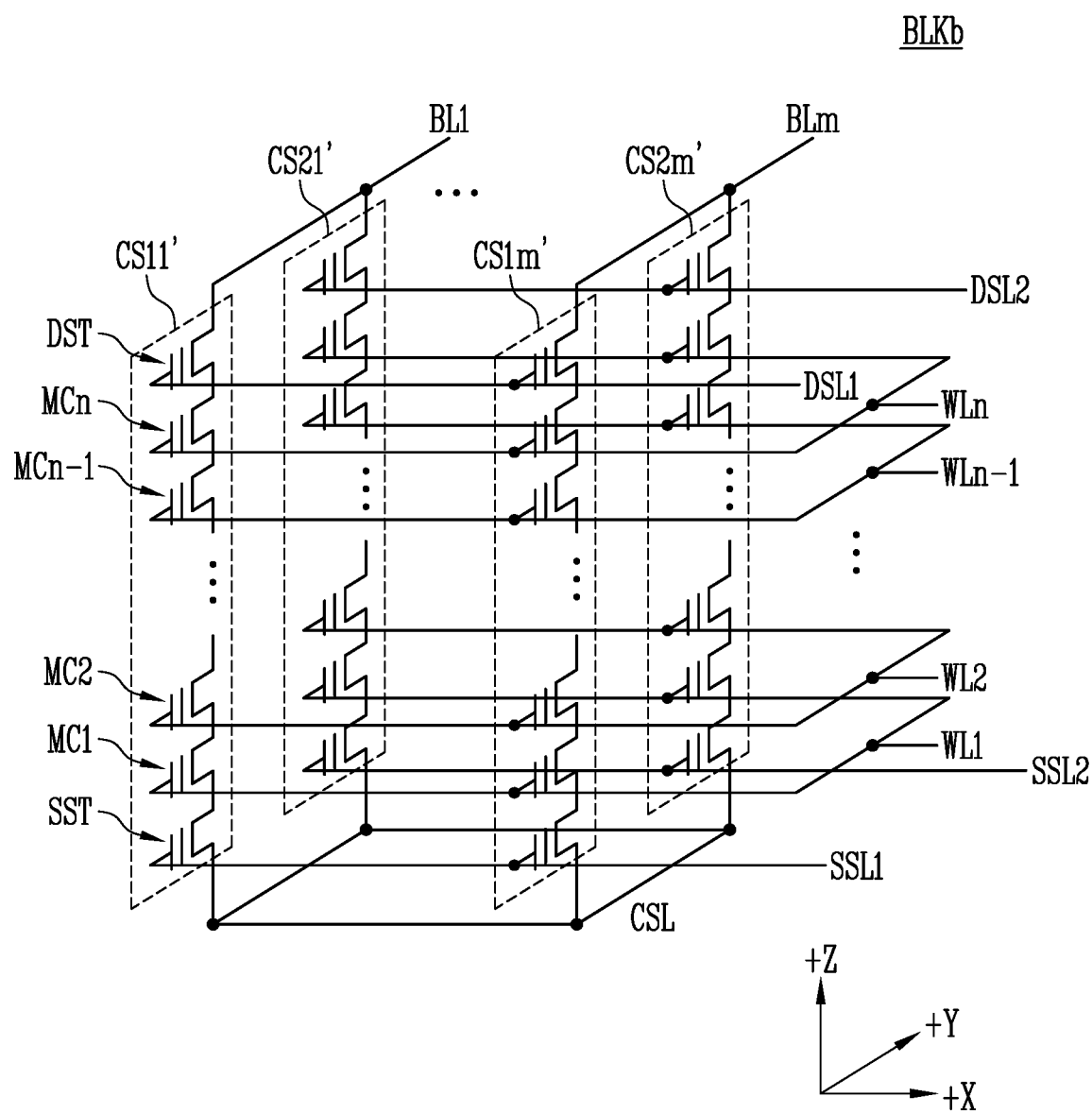
FIG. 6 is a circuit diagram illustrating another embodiment of a representative memory block BLKb of the memory blocks BLK1 to BLKz of FIG. 3.

FIG. 6 is a circuit diagram illustrating another embodiment of a representative memory block BLKb of the memory blocks BLK1 to BLKz of FIG. 3.

Referring to FIG. 6, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. As another embodiment, the source select transistors of the cell strings CS11' to CS1$m$' and CS21' to CS2$m$' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1$m$' of a first row are connected to a first drain select line DSL1. The drain select transistors of the cell strings CS21' to CS2$m$' of a second row are connected to a second drain select line DSL2.

As a result, the memory block BLKb of FIG. 6 has an equivalent circuit similar to the memory block BLKa of FIG. 5 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1$m$' or CS21' to CS2$m$' arranged in the row direction may be connected to even bit lines, and odd-numbered cell strings among the cell strings CS11' to CS1$m$' or CS21' to CS2$m$' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control the dummy memory cell(s), each dummy memory cell may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 7:
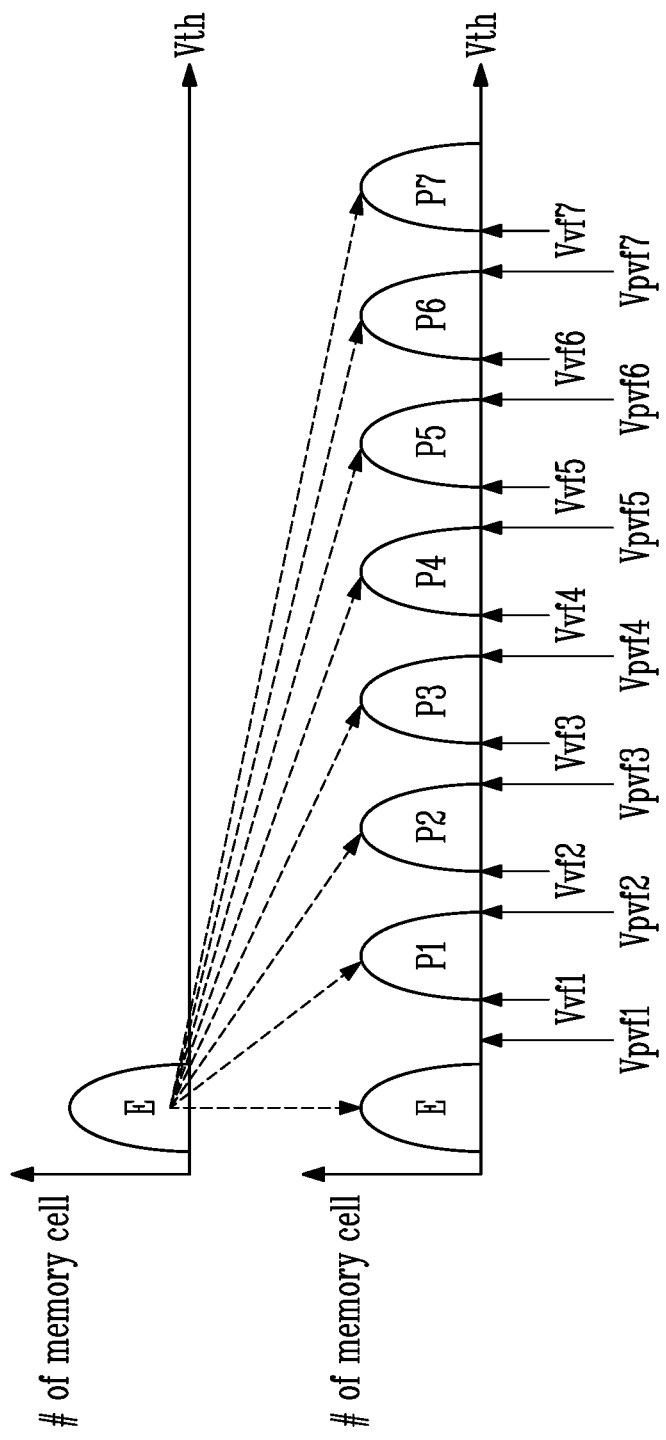
FIG. 7 is a diagram illustrating program states of a memory cell.

FIG. 7 is a diagram for describing the program states of the memory cell.

Referring to FIG. 7, the memory cell may be programmed in the erase state E or any of the seven program states P1 to P7 according to the threshold voltage. By way of example, the memory cells of the present disclosure are shown as a triple level cells (TLCs), each of which may be programmed in an erase state or any of seven program states, but the present invention is not limited to TLCs. For example, each memory cell may be a multi-level cell (MLC), a single level cell (SLC), a quad level cell (QLC), or higher capacity level cell. Here, the erase state is denoted as not a program state, but the erase state may be expressed as a zero-th program state P0. Therefore, the erase state E and the seven program states P1 to P7 may all be considered program states.

Memory cells connected to the selected word line may have a threshold voltage included in any one of the erase state E or the seven program states P1 to P7. That is, the memory cells may be programmed to have the threshold voltage included in any one of the erase state E or the seven program states P1 to P7. Before the program operation is performed, the memory cells may be in the erase state E. During the program operation, the memory cells in the erase state E may be programmed in any one of the seven program states as a program voltage is applied to the selected word line.

Adjacent program states may be divided by a main verify voltage and a pre-verify voltage. For example, the erase state E and the first program state P1 may be divided by a first pre-verify voltage Vpvf1 and a first main verify voltage Vvf1. The first program state P1 and the second program state P2 may be divided by a second pre-verify voltage Vpvf2 and a second main verify voltage Vvf2. The second program state P2 and the third program state P3 may be divided by a third pre-verify voltage Vpvf3 and a third main verify voltage Vvf3. The third program state P3 and the fourth program state P4 may be divided by a fourth pre-verify voltage Vpvf4 and a fourth main verify voltage Vvf4. The fourth program state P4 and the fifth program state P5 may be divided by a fifth pre-verify voltage Vpvf5 and a fifth main verify voltage Vvf5. The fifth program state P5 and the sixth program state P6 may be divided by a sixth pre-verify voltage Vpvf6 and a sixth main verify voltage Vvf6. The sixth program state P6 and the seventh program state P7 may be divided by a seventh pre-verify voltage Vpvf7 and a seventh main verify voltage Vvf7.

The pre-verify voltage and the main verify voltage may be used to determine a potential level pre-charged on the bit line or a level of the program voltage applied to the selected word line. For example, the threshold voltage of the memory cell may be divided into three states by the first pre-verify voltage and the first main verify voltage. That is, the threshold voltage of the memory cell may be divided into a first state lower than the first pre-verify voltage, a second state greater than the first pre-verify voltage and lower than the first main verify voltage, and a third state greater than the first main verify voltage.

A memory cell having a threshold voltage of the first state may be programmed using a program voltage having a level higher than a program voltage of a memory cell having a threshold voltage of the second state or the third state. Alternatively, a bit line connected to the memory cell having the threshold voltage of the first state may be pre-charged to a level higher than that of a bit line connected to the memory cell having the threshold voltage of the second state or the third state.

A memory cell having the threshold voltage of the second state may be programmed using a program voltage having a level lower than that of the memory cell having the threshold voltage of the first state and a level higher than a program voltage of the memory cell having the threshold voltage of the third state. Alternatively, a bit line connected to the memory cell having the threshold voltage of the second state may be pre-charged to a voltage having a level lower than that of the bit line connected to the memory cell having the threshold voltage of the first state and a level higher than that of the bit line connected to the memory cell having the threshold voltage of the third state.

A program method shown in FIG. 7 may form one erase state E and the seven program states P1 to P7. The program states shown in FIG. 7 may be formed while a program operation including first to M-th program loops shown in FIG. 8 is performed once.

Figure 8:
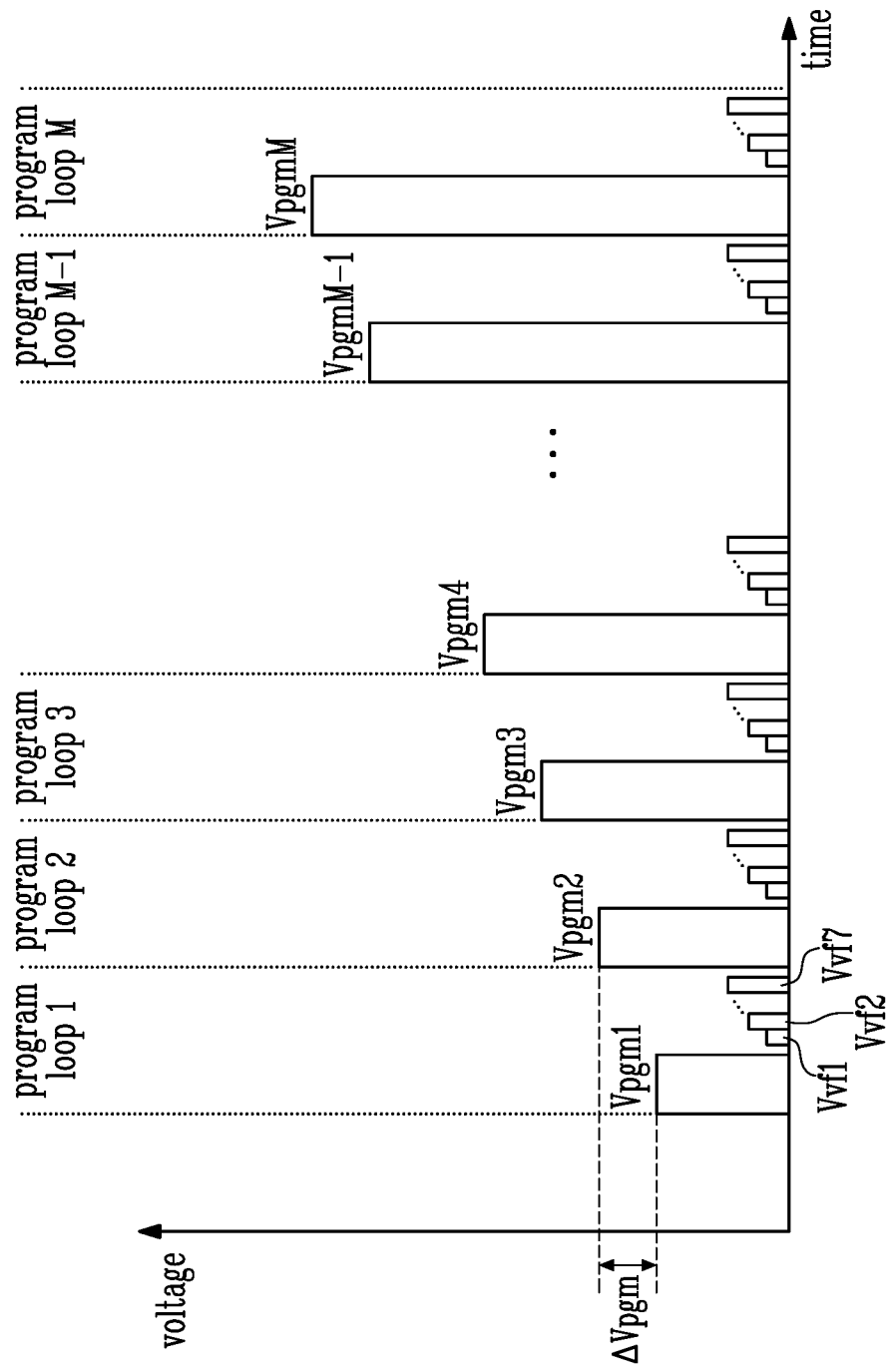
FIG. 8 is a diagram for describing a voltage applied to a selected word line during a program operation.

FIG. 8 is a diagram for describing a voltage applied to the selected word line during the program operation.

Referring to FIG. 8, the program operation for forming the program state of FIG. 7 may include M program loops. Each program loop may include an operation of applying the program voltage to the selected word line and an operation of applying the verify voltage to the selected word line. The operation of applying the program voltage may be included in a program period, and the operation of applying the verify voltage may be included in a verify period. For example, a first program loop may include an operation of applying a first program voltage Vpgm1 and a plurality of main verify voltages Vvf1 to Vvf7 to the selected word line. By way of example, the seven main verify voltages are applied in every program loop, but the number of verify voltages is not limited thereto. Rather, different main verify voltages and pre-verify voltages may be applied consistent with the teachings herein.

As subsequent program loops are performed, the program voltage may increase by a step voltage ΔVpgm. For example, a second program voltage Vpgm2 applied to the selected word line in a second program loop may be greater than the first program voltage Vpgm1 by the step voltage ΔVpgm. While the step voltage is shown as being fixed, the invention is not limited to that configuration. Rather, the step voltage may be different for different program loops and may be dynamically changed.

A memory cell that reaches a target program state as the M program loops are performed may be in a program inhibit state so that no further programming is applied to that memory cell. Even though a subsequent program loop is performed, a threshold voltage of the memory cell in the program inhibit state may be maintained. For example, a memory cell in which a program is completed in the second program state P2 which is the target program state in a second program loop may be in the program inhibit state in a third program loop. In an embodiment, a bit line of the memory cell reaching the target program state may be pre-charged to a program inhibit voltage. When the bit line is pre-charged to the program inhibit voltage, a channel of the memory cell may be self-boosted by the program voltage and the memory cell may not be programmed.

Figure 9:
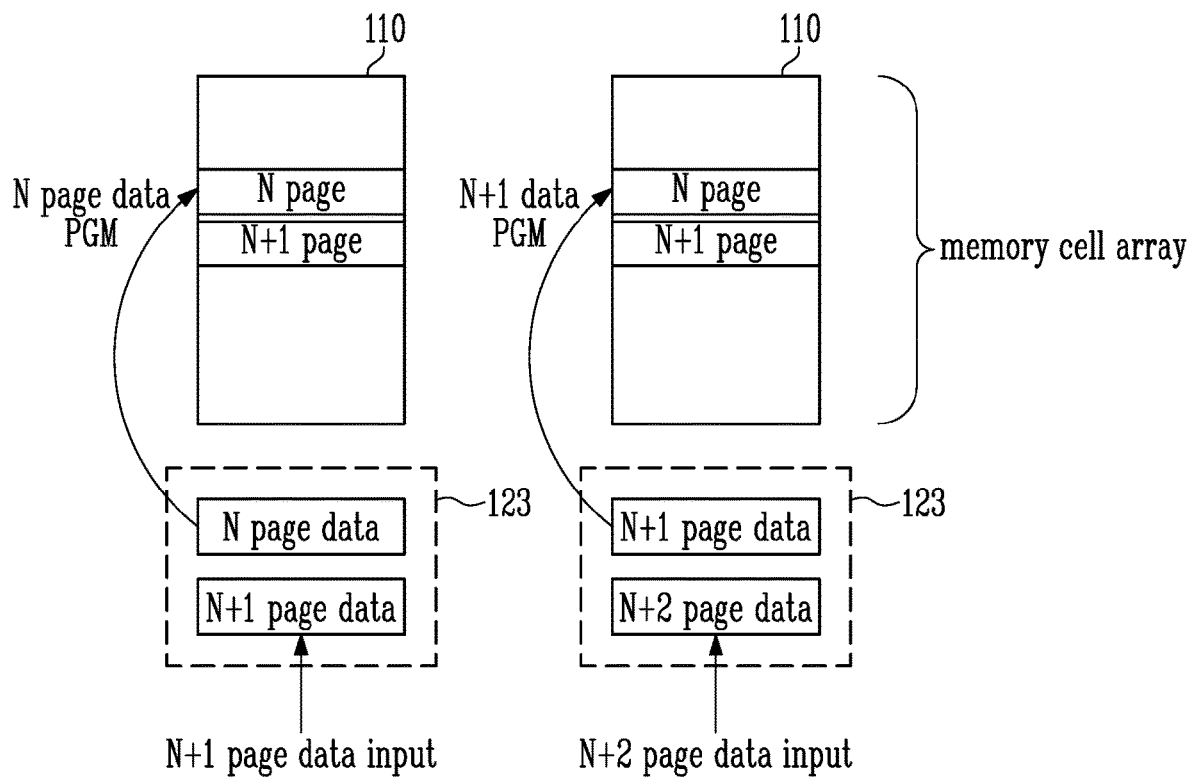
FIG. 9 is a diagram for describing a cache program operation.

FIG. 9 is a diagram for describing a cache program operation.

Referring to FIG. 9, a plurality of pages included in the memory cell array 110 may be sequentially programmed. For example, an N-th page and an (N+1)-th page may be sequentially programmed. The plurality of pages may be programmed according to the data temporarily stored in the page buffer group 123. For example, N-th page data temporarily stored in the page buffer group 123 may be programmed in an N-th page included in the memory cell array 110.

During the cache program operation, while the N-th page data is programmed in the N-th page, (N+1)-th data may be input to the page buffer group 123.

When the N-th page data is programmed in the N-th page, the (N+1)-th page data temporarily stored in the page buffer group 123 may be programmed in the (N+1)-th page. During the cache program operation, while the (N+1)-th page data is programmed in the (N+1)-th page, (N+2)-th data may be input to the page buffer group 123.

While data is programmed in the memory cell array 110, data to be programmed in the next page is input to the page buffer group 123, and thus a program time for programming data in the entire page may be reduced.

Figure 10:
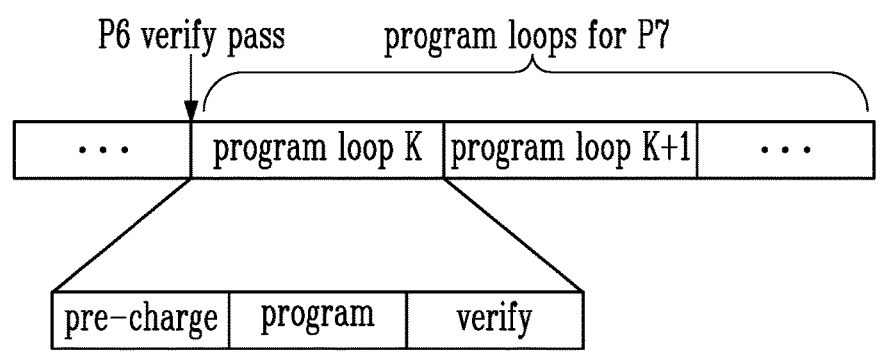
FIG. 10 is a diagram for describing a program loop.

FIG. 10 is a diagram for describing a program loop.

Referring to FIG. 10, each program loop may include a pre-charge period, a program period, and a verify period.

In the pre-charge period a pre-charge voltage may be applied to the bit line. The pre-charge voltage may be a program permission voltage or a program inhibit voltage. The program permission voltage may be 0V and the program inhibit voltage may be a power voltage Vcc. The pre-charge voltage may be a double program voltage of a level greater than the program permission voltage and lower than the program inhibit voltage.

In the program period an operation voltage is applied to the word line so that the threshold voltage of the selected memory cell is in the target program state. The program period may be a period for making the program state of the selected memory cell the target program state. In the program period the program voltage Vpgm is applied to the selected word line and the pass voltage Vpass is applied to an unselected word line.

The verify period may be a period for verifying whether the program state of the selected memory cell has reached the target program state after the program period. The verify period may include a period for sensing the bit line. In the verify period, the sensing circuit 126 may generate a reference current in response to the permission bit signal VRYBIT, and may output the pass signal PASS or the fail signal FAIL by comparing the sensing voltage VPB received from the page buffer group 123 with the reference voltage generated by the reference current. The sensing circuit 126 may output the pass signal PASS or the fail signal FAIL by comparing the sensing current received from the page buffer group 123 with the reference current. The sensing voltage VPB is compared with the reference voltage, but the pass signal PASS or the fail signal FAIL may be output by comparing a sensing current IPB with the reference current. After the verify operation for the sixth program state P6 passes, the verify period may include a time period for storing data sensed from the bit line.

As shown in FIG. 10, when verification for the sixth program state P6 passed before a K-th program loop, the K-th program loop (and subsequent programs loops) may be for forming the seventh program state P7. Memory cells of which the target program state is the sixth program state P6 may be in the program inhibit state and thus may not be programmed from the K-th program loop. For example, in the pre-charge period of the K-th program loop, as the power voltage Vcc is applied to the bit line of the memory cell reaching the sixth program state P6 which is the target program state, the memory cell reaching the sixth program state P6 may be in the program inhibit state.

Memory cells of which the target program state is the seventh program state P7 may be in a program permission state and programming may be performed from the K-th program loop. For example, in the pre-charge period of the K-th program loop, as a ground voltage GND or 0V is applied to the bit line of the memory cell of which the target program state is the seventh program state P7, the memory cell of which the target program state is the seventh program state P7 may be programmed.

Figure 11:
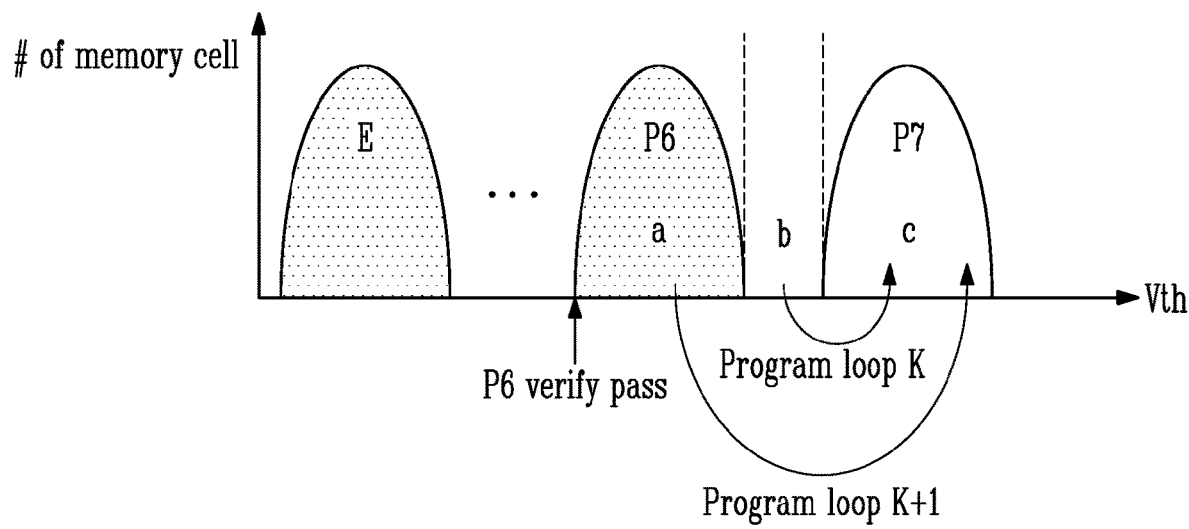
FIG. 11 is a diagram for describing a process of programming the memory cell to a seventh program state.

FIG. 11 is a diagram for describing a process of programming the memory cell to the seventh program state.

Referring to FIG. 11, when the verify operation for the sixth program state P6 passes in the (K−1)-th program loop, memory cells of which the target program state is the erase state E to the sixth program state P6 may be controlled not to be programmed in the K-th program loop. For example, the bit line of the memory cells of which the target program state is the erase state E to the sixth program state P6 may be pre-charged to the program inhibit voltage in the pre-charge period of the K-th program loop, and thus the bit line may not be programmed in the K-th program loop.

The memory cells of which the target program state is the seventh program state P7 may be programmed in the K-th and subsequent program loops. For example, the bit lines of the memory cells of which the target program state is the seventh program state P7 may be pre-charged to the program permission voltage in the pre-charge period of the K-th program loop.

As shown in FIG. 11, a target program state of a first memory cell "a", a second memory cell "b", and a third memory cell "c" may be the seventh program state P7. Since a threshold voltage of the first memory cell "a" is lower than that of the second memory cell "b" and the third memory cell "c", the first memory cell "a" may reach the seventh program state P7 after the K-th program loop and a (K+1)-th program loop are progressed. The first memory cell "a" reaching the seventh program state P7 may be in the program inhibit state. The second memory cell "b" may reach the seventh program state P7 after the program period of the K-th program loop is progressed, and may be in the program inhibit state. In the program inhibit state, the program inhibit voltage may be applied to the bit line in the next program loop. The program inhibit voltage may be a power voltage Vcc. Since the third memory cell "c" is already programmed to the seventh program state P7, the third memory cell "c" may be in the program inhibit state before the K-th program loop. The program operation controller 131 may program the first memory cell "a" using a program voltage of a level higher than that used when programming the second memory cell "b". Alternatively, the program operation controller 131 may program the first memory cell "a" using a bit line pre-charge voltage of a level higher than that used when programming the second memory cell "b".

Figure 12:
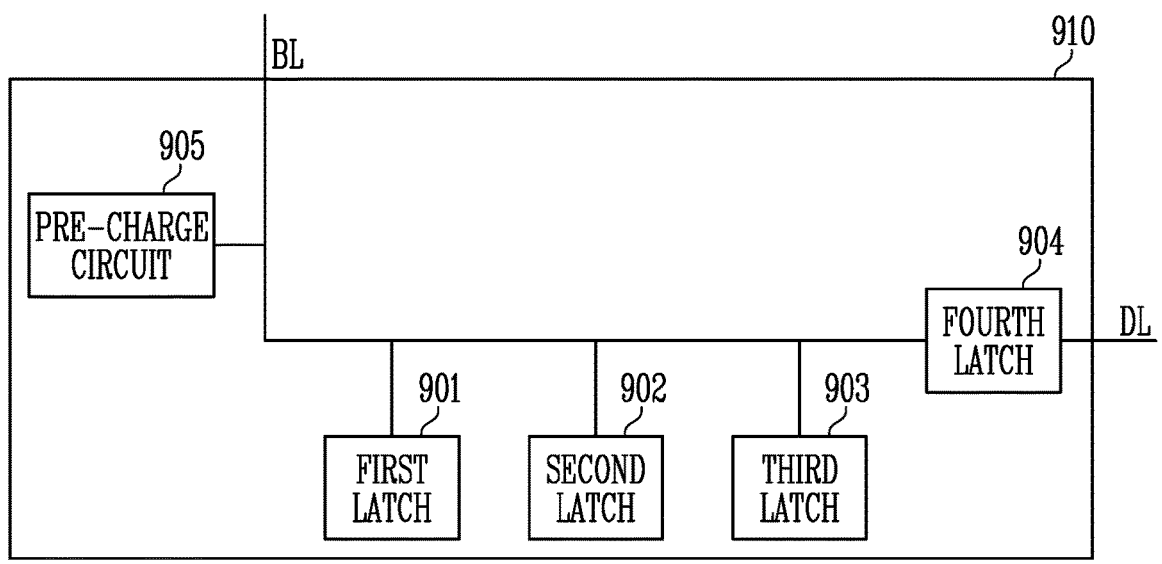
FIG. 12 is a diagram illustrating a page buffer.

FIG. 12 is a diagram illustrating a page buffer.

Referring to FIG. 12, the page buffer 910 may include a first latch 901, a second latch 902, a third latch 903, a fourth latch 904, and a pre-charge circuit 905. The page buffer 910 may be any one of the plurality of page buffers PB1 to PBn included in the page buffer group 123 shown in FIG. 2.

The page buffer 910 may be connected to the memory cell array 110 through the bit line BL. The page buffer 910 may operate in response to control of the program operation controller 131 during the program operation. Specifically, the page buffer 910 may operate in response to the page buffer control signals PBSIGNALS. The page buffer 910 may exchange data with the column decoder 124 through the data lines DL.

The first latch 901 may store pre-charge data used to determine a voltage to which the bit line is pre-charged or store data sensed from the bit line. The second latch 902 to the fourth latch 904 may temporarily store data to be programmed in the memory cell connected to the bit line BL. For example, the second latch 902 may temporarily store an MSB bit, the third latch 903 may store a CSB bit, and the fourth latch 904 may store an LSB bit. Since the fourth latch 904 is connected to the data line DL, the fourth latch 904 may receive data from the outside.

In the first latch 901, the data sensed from the bit line BL may be transferred to the sensing circuit 126. The sensed data may be the sensing voltage VPB or the sensing current IPB. The sensing circuit 126 may generate the reference current in response to the permission bit signal VRYBIT, and outputs verify information by comparing the sensing voltage VPB received from the page buffer 910 with the reference voltage generated by the reference current. The verify information may be the pass signal PASS or the fail signal FAIL. The verify information may be stored in any one of the second latch 902 to the fourth latch 904. The program operation controller 131 may determine whether to pre-charge the bit line based on the verify information. When the verify operation for the sixth program state P6 passes, the program operation controller 131 may determine whether to pre-charge the bit line based on the data sensed by the first latch 901.

The pre-charge circuit 905 may pre-charge the bit line to the program permission voltage or the program inhibit voltage according to the control of the program operation controller 131. Alternatively, the pre-charge circuit 905 may pre-charge the bit line to a double program voltage.

The program operation controller 131 according to the present disclosure may form the erase state E or the seven program states P1 to P7 through one program operation including the first to M-th program loops shown in FIG. 8. While the program operation is performed, the page buffer 910 may store all of the MSB, CSB and LSB bits. For example, the second latch 902 may store the MSB bit, the third latch 903 may store the CSB bit, and the fourth latch 904 may store the LSB bit. The type of bits stored in each of the second latch 902 to the fourth latch 904 are not limited to the specifics described above.

However, when a verify operation for a set program state passes, even though at least one of the MSB bit, the CSB bit, or the LSB bit is not stored in the page buffer 910, the memory cell may be programmed to the next program state. For example, when the verify operation for the fifth program state P5 passes, even though the LSB bit is not stored in the page buffer 910, the memory cell may be programmed to the sixth program state P6 or the seventh program state P7. Alternatively, when the verify operation for the sixth program state P6 passes, even though the CSB bit is not stored in the page buffer 910, the memory cell may be programmed to the seventh program state P7.

When at least one of the bits stored in the second latch 902 to the fourth latch 904 is not necessary to form the program state, a bit to be stored in the next page may be input to a latch in which an unnecessary bit is stored.

For example, when the verify operation for the fifth program state P5 passes, the LSB bit to be stored in the next page may be input into the fourth latch 904 instead of the LSB bit stored in the fourth latch 904. The LSB bit of the next page input to the fourth latch 904 may be moved to the second latch 902 or the third latch 903. That is, since the fourth latch 904 may receive data from the outside through the data line DL, after the LSB bit input to the fourth latch 904 is moved to another latch, another bit may be input to the fourth latch 904.

In addition, when the verify operation for the sixth program state P6 passes, the CSB bit to be stored in the next page may be input into the fourth latch 904 instead of the CSB bit stored in the third latch 903. Specifically, the LSB bit input to the fourth latch 904 may be moved to the second latch 902, and the CSB bit of the next page may be input to the fourth latch 904, and the CSB bit of the next page may be moved to the third latch 903. For convenience of description, the LSB bit to be stored in the next page is input into the fourth latch 904 instead of the LSB bit stored in the fourth latch 904, and the CSB bit to be stored in the next page is input into the third latch 903 instead of the CSB bit stored in the third latch 903. However, a bit that is not necessary to form the next program state, among the LSB bit, the CSB bit, or the MSB bit, is removed from the latch, and the bit to be stored in the next page may be input.

Since the program loop is performed based on the verify information, even though the verify operation for the sixth program state P6 passed, the verify information is to be stored in the page buffer 910. Therefore, even though the LSB bit of the next page is stored in the second latch 902 and the CSB bit of the next page is stored in the fourth latch 904, when the verify information is stored in the third latch 903, the MSB bit of the next page may not be stored in the page buffer 910. The first latch 901 according to an embodiment may receive the verify information from the third latch 903. The program operation controller 131 according to an embodiment may perform an operation corresponding to the pre-charge period, the program period, and the verify period based on the verify information transferred to the first latch 901.

During the verify operation, the page buffer 910 may further include a fifth latch (not shown) that stores pre-verify information indicating whether to apply the pre-verify voltage having a potential level lower than the main verify voltage to the selected word line before applying the main verify voltage to the selected word line.

FIG. 13 is a diagram illustrating the program operation controller.

Referring to FIG. 13, the program operation controller 131 may include a program state determiner 132, a page buffer controller 133, and a latch inverter 134.

The program operation controller 131 may control the peripheral circuit 120 including the page buffer 910 so that the data temporarily stored in the page buffer 910 is stored in the memory cell connected to the bit line. The program operation controller 131 may form the erase state E or any of the seven program states P1 to P7 through one program operation including the first to M-th program loops shown in FIG. 8.

The program state determiner 132 may determine the program state of the memory cell. The program state determiner 132 may determine the program state of the memory cell by using the number of program loops, a level of the verify voltage, the verify information, and the like. For example, when the verify information stored in the page buffer 910 indicates a pass and the verify voltage is the fifth main verify voltage Vvf5, the program state determiner 132 may determine that the program state of the memory cell is the fifth program state P5. Alternatively, the program state determiner 132 may directly receive the verify information of the verify operation, that is, pass or fail information, from the sensing circuit 126.

The page buffer controller 133 may control the page buffer 910 by outputting the page buffer control signals PBSIGNALS. The page buffer controller 133 may control data to be moved between the plurality of latches 901 to 904 included in the page buffer 910. For example, the page buffer controller 133 may move the data between the latches so that the LSB bit, the CSB bit, or the MSB bit to be stored in the next page is input to the page buffer 910. The page buffer controller 133 may control the pre-charge circuit 905 and the plurality of latches 901 to 904 so that the data stored in the page buffer 910 is stored in the memory cell. The page buffer controller 133 may control the page buffer 910 in the pre-charge period, the program period, and the verify period.

The latch inverter 134 may invert the data stored in the plurality of latches in the page buffer 910. For example, when the first latch 901 stores data indicating "0", the latch inverter 134 may obtain timing information from the page buffer controller 133 and invert the data stored in the first latch 901 so that the data stored in the first latch 901 indicates "1" based on the timing information.

FIGS. 14A and 14B are diagrams for describing a data movement between latches according to an embodiment.

Referring to FIG. 12 and FIG. 14A, when the verify operation for the sixth program state P6 passes, sensing information sensed from the bit line may be stored in the first latch 901.

The LSB bit to be stored in the next page, that is, the (N+1)-th page, may be stored in the second latch 902. The LSB bit may be input after the verify operation for the first to fifth program states P1 to P5 passes.

The CSB bit to be stored in the (N+1)-th page maybe stored in the fourth latch 904. The CSB bit may be input after the verify operation for the first to sixth program states P1 to P6 passes.

The verify information may be stored in the third latch 903. Since the pre-charge circuit 905 pre-charges the bit line based on the verify information, the verify information is to be stored in the page buffer 910. Therefore, even though the verify operation for the sixth program state P6 has passed, when the verify information is stored in the third latch 903, the MSB bit to be stored in the (N+1)-th page may not be input to the page buffer 910.

By way of example, the second latch 902 stores the LSB bit to be stored in the (N+1)-th page, the third latch 903 stores the verify information, and the fourth latch 904 stores the CSB bit to be stored in the (N+1)-th page. However, other arrangements may be used to store different types of bits in different latches.

Referring to FIG. 12 and FIG. 14B, when the data is moved between the plurality of latches, the verify information stored in the third latch 903 may be moved to the first latch 901. That is, when the verify operation for the sixth program state P6 passes, the bit line may be pre-charged using the verify information stored in the third latch 903, and the data sensed from the bit line for the seventh program state P7 may be latched into the first latch 901, which may be used as the verify information. The CSB bit to be stored in the (N+1)-th page stored in the fourth latch 904 may be moved to the third latch 903. The MSB bit to be stored in the (N+1)-th page may be input to the fourth latch 904. That is, since the verify information stored in the third latch 903 is moved to the first latch 901, before the program operation for the N-th page is completed, the second latch 902, the third latch 903, and the fourth The latch 904 may store all of the MSB bit, the CSB bit, and the LSB bit to be stored in the (N+1)-th page, thereby increasing efficiency of the cache program operation.

Figure 15:
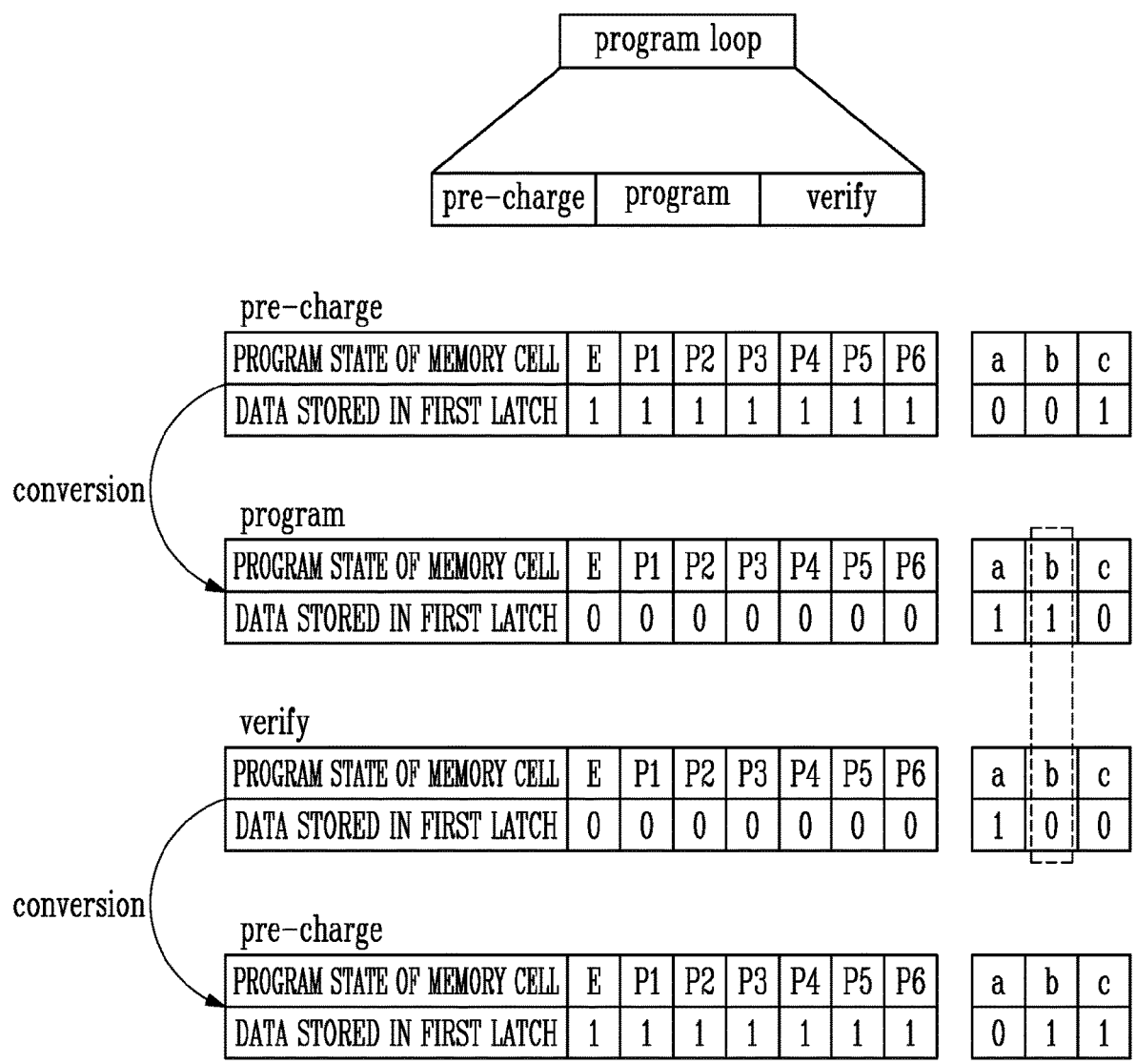
FIG. 15 is a diagram for describing a method of controlling a first latch according to an embodiment of the present disclosure.

FIG. 15 is a diagram for describing a method of controlling the first latch according to an embodiment of the present disclosure.

Referring to FIG. 15, when the verify operation for the sixth program state P6 passes, the program loop may be performed to form the seventh program state P7. For example, the memory cells of which the target program state is the seventh program state P7 may be the first memory cell "a", the second memory cell "b", and the third memory cell "c" as shown in FIG. 11.

FIG. 15 may illustrate data stored in the first latch 901 of the memory cells programmed to the first to sixth program states P1 to P6 as well as the first memory cell "a", the second memory cell "b", and the third memory cell "c".

When the verify operation for the sixth program state P6 is passed in the current program loop, in the pre-charge period of the next program loop, the memory cell programmed to the erase state E may be in the program inhibit state. Specifically, the data of the first latch 901 may be set to pre-charge the program inhibit voltage to the bit line. For example, "1" indicating the program inhibit voltage may be stored in the first latch 901. Similarly, "1" indicating the program inhibit voltage may be stored in the first latch 901 of the memory cell programmed to the first program state P1 to the sixth program state P6.

As shown in FIG. 11, the target program state of the first memory cell "a", the second memory cell "b", and the third memory cell "c" may be the seventh program state P7. "0" indicating the program permission voltage may be stored in the first latch 901 of the first memory cell "a" and the second memory cell "b". Since the third memory cell "c" already reaches the seventh program state P7, it is assumed that the third memory cell "c" is in the program inhibit state.

In the program period, a threshold voltage of the first memory cell "a" and the second memory cell "b" may increase by the program voltage applied to the selected word line according to information stored in the first latch 901. The latch inverter 134 may invert the data stored in the first latch 901 while the operation voltage is applied to the selected word line and the unselected word line in the program period. As the latch inverter 134 inverts the data stored in the first latch 901, "0" may be stored in the first latch 901 of the memory cells programmed to the erase state E to the sixth program state P6 and the third memory cell "c", and "1" may be stored in the first latch 901 of the first memory cell "a" and the second memory cell "b". In the program period, the threshold voltage of the second memory cell "b" may reach the seventh program state P7, and the threshold voltage of the first memory cell "a" may not reach the seventh program state P7.

In the verify period, the bit line targeted for the program may be pre-charged. The verify voltage greater than the threshold voltage of the first to sixth program states may be applied to the selected word line. In the verify period, the information sensed from the bit line may be stored in the first latch 901. Since the memory cell programmed to the erase state E and the first to sixth program states P1 to P6 and the third memory cell "c" are not pre-charged in the verify period, the sensed data may indicate "0". Since the threshold voltage of the first memory cell "a" is lower than the verify voltage, a current may flow through the first memory cell "a". Therefore, the data sensed from the bit line may indicate "1", which is information indicating that the voltage pre-charged to the bit line is discharged in the verify period. Since the threshold voltage of the second memory cell "b" reaches the seventh program state P7 in the program period, the threshold voltage may be greater than verify voltage. Therefore, the data sensed from the bit line may indicate "0", which is information indicating that the voltage pre-charged is maintained to the bit line in the verify period.

The latch inverter 134 may invert the data stored in the first latch 901 before the pre-charge period to perform the next program loop. Since the second memory cell "b" is programmed to the seventh program state P7, "1" indicating the program inhibit voltage may be stored in the first latch 901 of the second memory cell "b".

Figure 16:
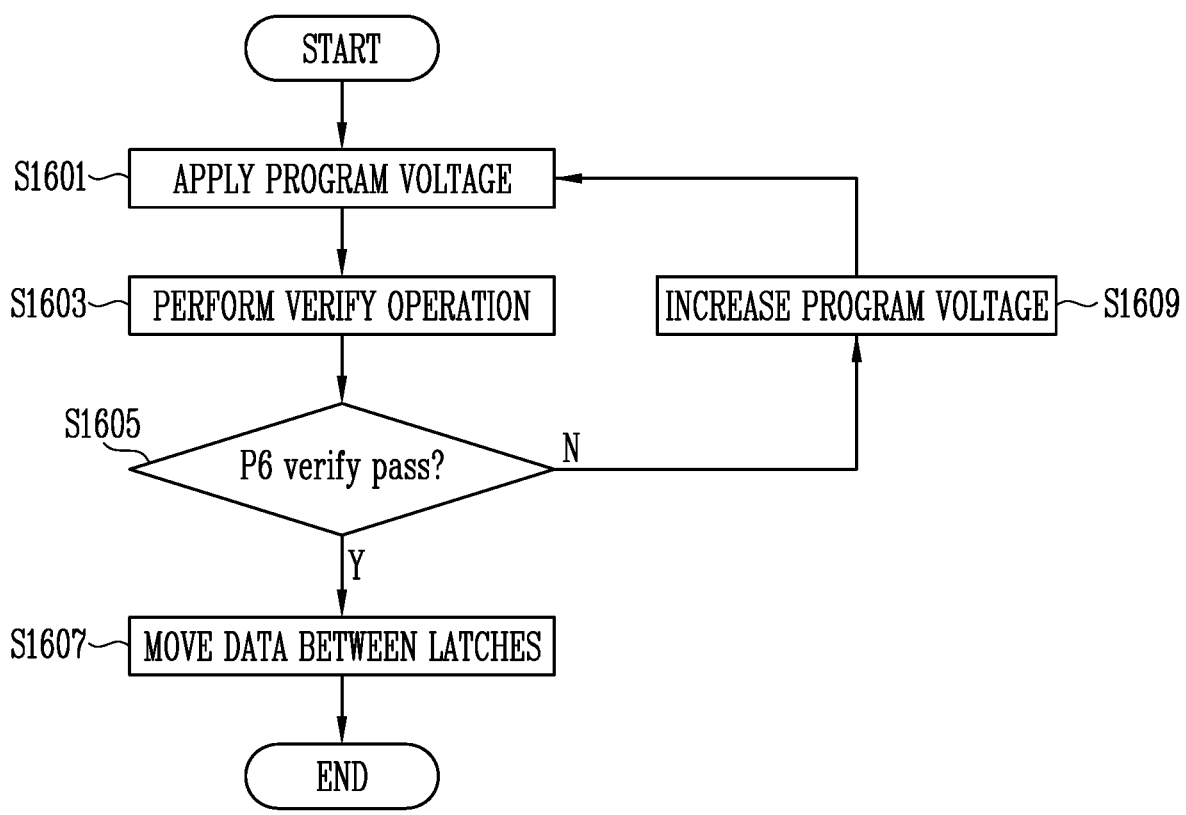
FIG. 16 is a diagram for describing a program operation according to an embodiment of the present disclosure.

FIG. 16 is a diagram for describing the program operation according to an embodiment.

Referring to FIG. 16, the program operation controller 131 may control the peripheral circuit 120 so that the data temporarily stored in the page buffer group 123 is programmed in the memory cell array 110. In step S1601, the program operation controller 131 may control the peripheral circuit 120 to apply the program voltage to the selected word line. Specifically, in the program period of the first program loop, the program operation controller 131 may control the peripheral circuit 120 to apply the first program voltage to the selected word line. That is, the program operation controller 131 may control the peripheral circuit 120 to program data in the N-th page.

In step S1603, the program operation controller 131 may control the peripheral circuit 120 to apply at least one of the first to seventh main verify voltages or the first to seventh pre-verify voltages to the selected word line in the verify period of the first program loop.

In step S1605, the program operation controller 131 may determine whether the verify operation for the sixth program state P6 passed. Information as to whether the verify operation for the sixth program state P6 passed may be received from the sensing circuit 126 or from one of the latches in the page buffer 910. When it is determined that the verify operation passed, the process may move to step S1607; otherwise, the process may move to step S1609.

In step S1609, the program operation controller 131 may increase the program voltage by the step voltage to perform the second program loop. The program operation controller 131 may repeat steps S1601, S1603, S1605, and S1609 until the verify operation for the sixth program state P6 passes.

In step S1607, the program operation controller 131 may control the page buffer 910 to move the data between the plurality of latches 901 to 904 in the page buffer 910. Specifically, the program operation controller 131 may control the page buffer 910 by outputting the page buffer control signals PBSIGNALS.

Figure 17:
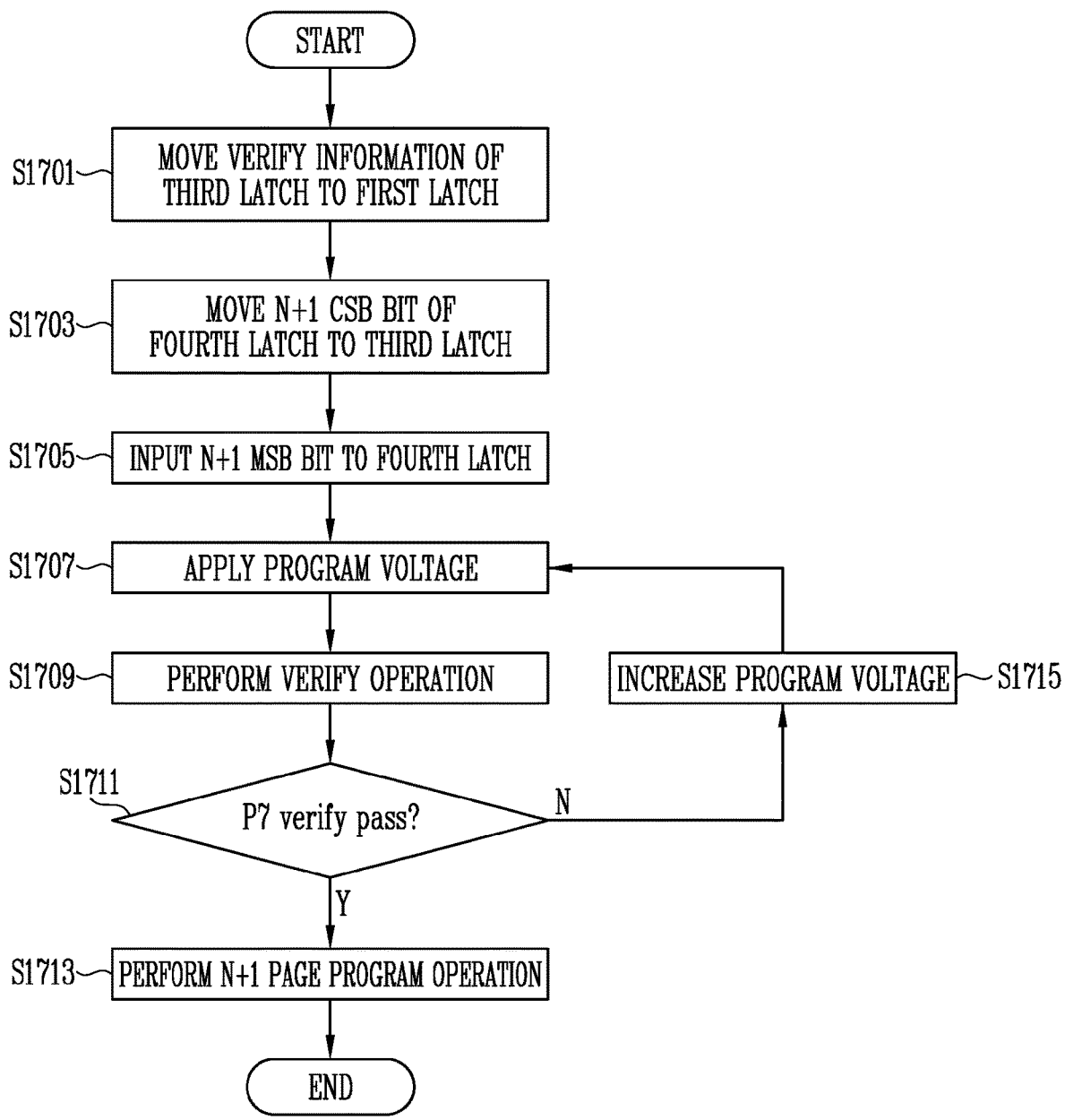
FIG. 17 is a diagram for describing a program operation after a verify operation for a sixth program state passes.

FIG. 17 is a diagram for describing the program operation after the verify operation for the sixth program state passes.

Referring to FIG. 17, in step S1701, the program operation controller 131 may move the verify information stored in the third latch 903 to the first latch 901. This is merely an example. After the verify operation for the sixth program state P6 passes, the verify information may be stored in any of the second to fourth latches 902 to 904. Therefore, more generally, in step S1701, the verify information may be moved from whichever of the second to fourth latches 902 to 904 in which the verify information is stored to the first latch 901.

In step S1703, the program operation controller 131 may move the CSB bit to be stored in the (N+1)-th page from the fourth latch 904 to the third latch 903. This is merely an example. After the verify operation for the sixth program state P6 passes, any of the MSB bit, the LSB bit, or the CSB bit to be stored in then (N+1)-th page may be stored in the fourth latch 904. Therefore, in step S1703, whichever of the MSB bit, the LSB bit, and the CSB bit to be stored in the (N+1)-th page is stored in the fourth latch 904 may be moved to the third latch 903.

In step S1705, the program operation controller 131 may control the peripheral circuit 120 to input the MSB bit to be stored in the (N+1)-th page to the fourth latch 904. This is merely an example. The program operation controller 131 may control the peripheral circuit 120 to input a bit, which is not yet stored in the page buffer 910, among the bits to be stored in the (N+1)-th page to the fourth latch 904.

In step S1707, the program operation controller 131 may start the program loop for forming the seventh program state P7. Specifically, in the pre-charge period, the program operation controller 131 may pre-charge the bit line of the memory cell to be programmed to the seventh program state P7 based on the verify information moved to the first latch 901. The bit line of the memory cell in which the program is completed for the erase state E to the sixth program state P6 may be pre-charged to the program inhibit voltage. The program operation controller 131 may apply the program voltage to the selected word line in the program period. The program operation controller 131 may invert the data stored in the first latch 901 in the program period.

In step S1709, the program operation controller 131 may apply the verify voltage to the selected word line in the verify period. The program operation controller 131 may store the data sensed from the bit line in the first latch 901 after applying the verify voltage to the selected word line.

In step S1711, the program operation controller 131 may determine whether the verify operation for the seventh program state P7 passed based on the data stored in the first latch 901. When it is determined that the verify operation passed, the process may move to step S1713; otherwise, the process may move to step S1715.

In step S1715, the program operation controller 131 may increase the program voltage by the step voltage.

In step S1713, the program operation controller 131 may perform the program operation so that the data to be stored in the (N+1)-th page and currently latched in the page buffer 910 is stored in the (N+1)-th page. After applying the verify voltage to the selected word line, when the data sensed from the bit line is different from the data stored in the existing first latch 901, it may be determined that the verify operation for the seventh program state P7 passed. That is, the program operation controller 131 may control the program inhibit voltage to be pre-charged to the bit line during the next program loop by using the data sensed from the bit line.

Figure 18:
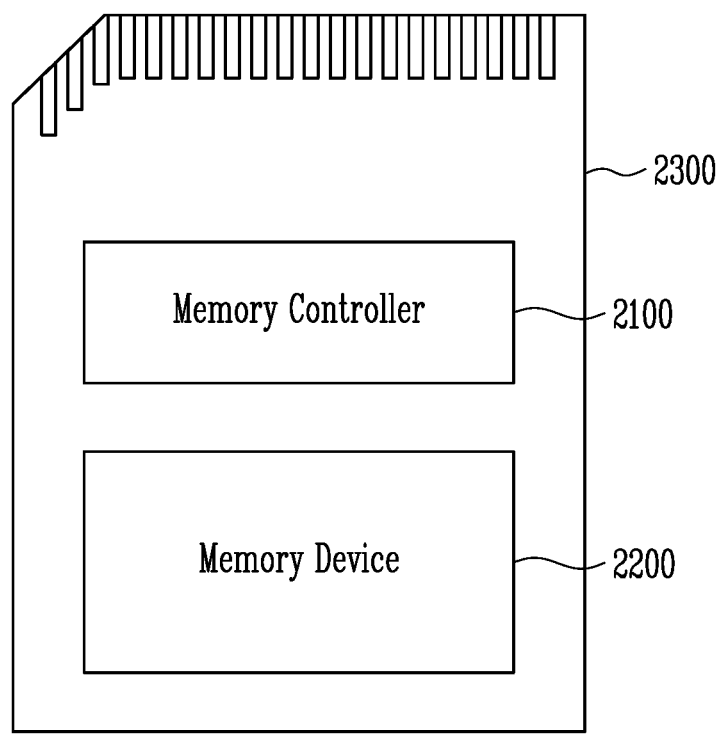
FIG. 18 is a block diagram illustrating a memory card system to which the storage device is applied according to an embodiment of the present disclosure.

FIG. 18 is a block diagram illustrating a memory card system to which the storage device is applied according to an embodiment of the present disclosure.

Referring to FIG. 18, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard.

For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe. For example, the connector 2300 may be defined by at least one of the various communication standards described above.

For example, the memory device 2200 may be implemented as any of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and/or a universal flash storage (UFS).

Figure 19:
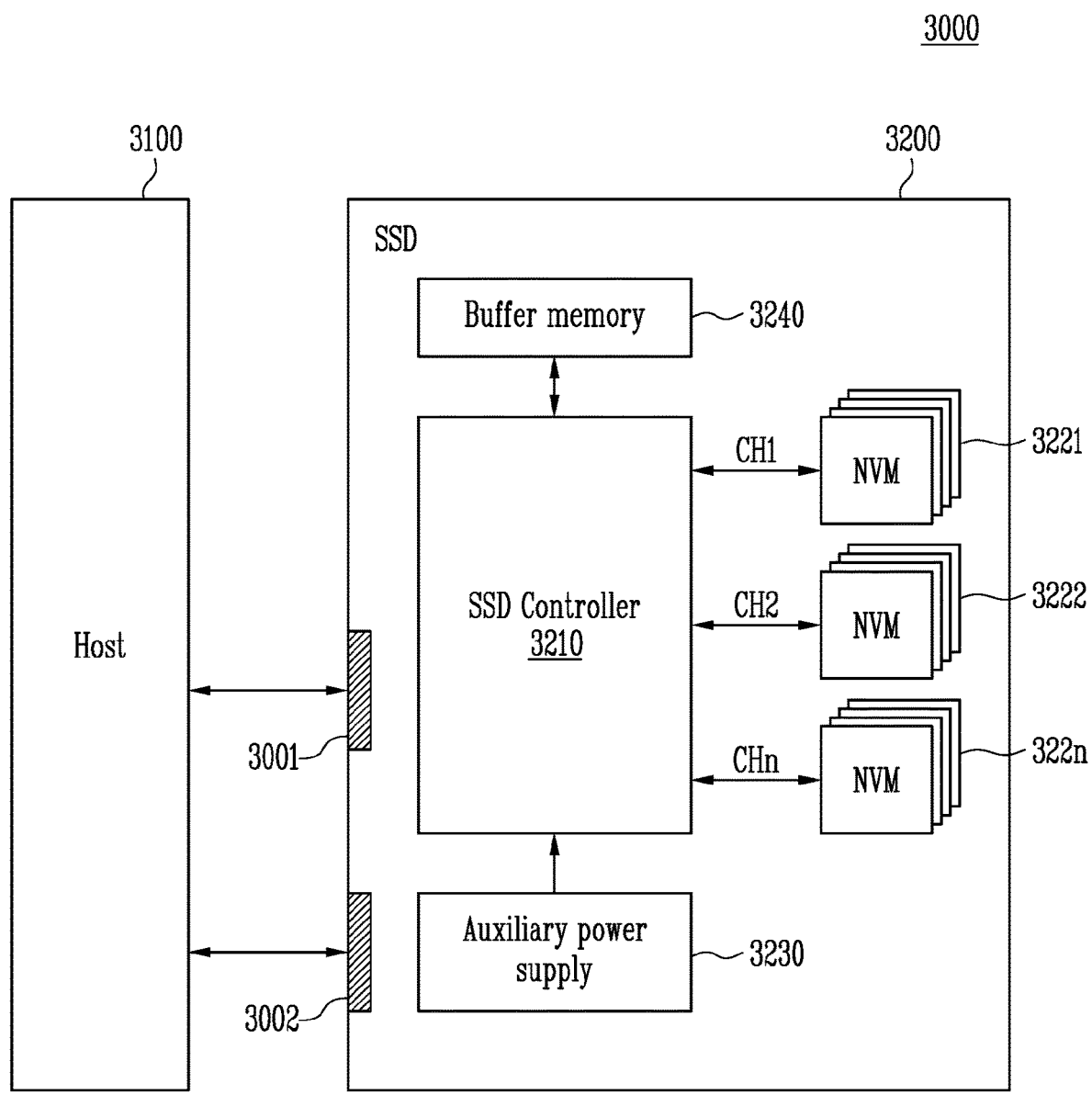
FIG. 19 is a block diagram illustrating a solid state drive (SSD) system to which the storage device is applied according to an embodiment of the present disclosure.

FIG. 19 is a block diagram illustrating a solid state drive (SSD) system to which the storage device is applied according to an embodiment of the present disclosure.

Referring to FIG. 19, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be based on an interface between the host 3100 and the SSD 3200. For example, the signal SIG may be defined by at least one of the following interfaces: a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 20:
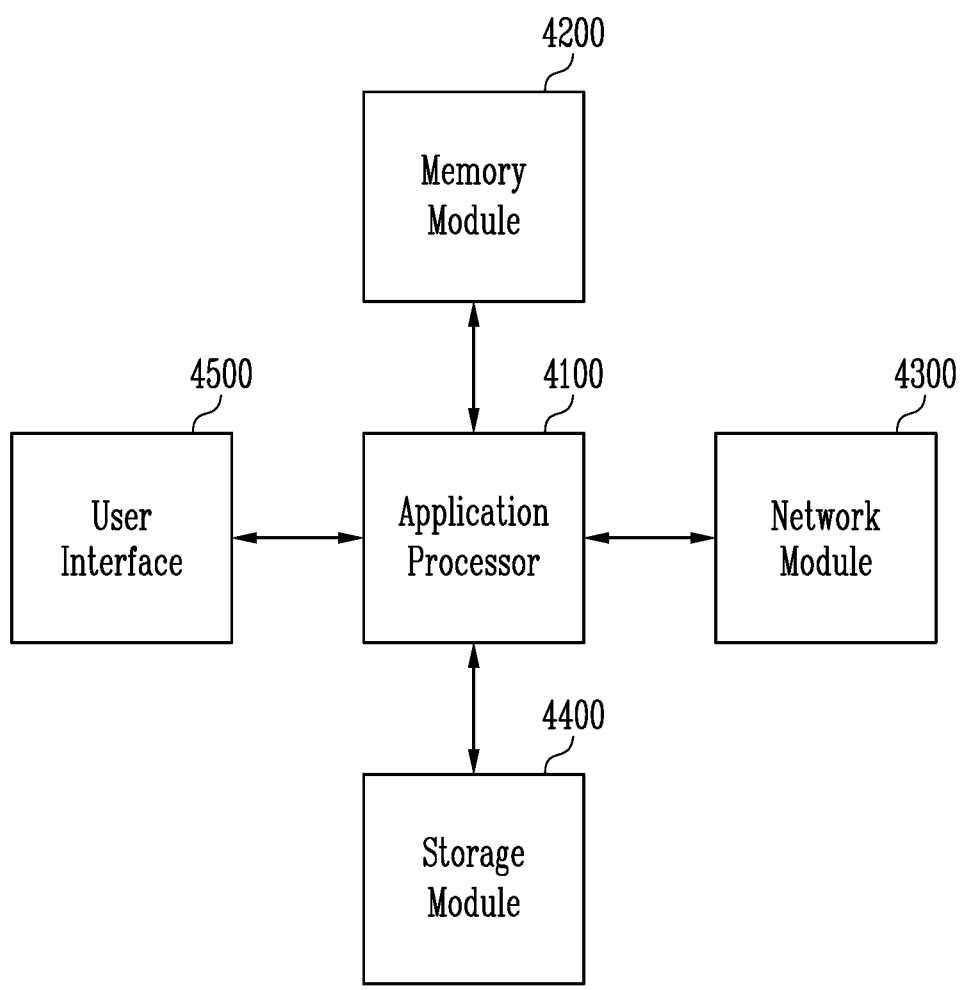
FIG. 20 is a block diagram illustrating a user system to which the storage device is applied according to an embodiment of the present disclosure.

FIG. 20 is a block diagram illustrating a user system to which the storage device is applied according to an embodiment of the present disclosure.

Referring to FIG. 20, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, which may operate the same as the memory device described with reference to FIGS. 10 to 13. The storage module 4400 may operate the same as the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

While the invention has been illustrated and described in connection with various embodiments, those skilled in the art will appreciate in light of the present disclosure that the various modifications may be made to any of the disclosed embodiments. The invention encompasses all such modifications that fall within the scope of the claims including their equivalents.

What is claimed is:

1. A memory device comprising:
   a plurality of memory cells configured to have threshold voltages corresponding to one of first to n-th program states, respectively, by a program operation, where n is a natural number greater than 1;
   a sensing latch configured to store data sensed from a bit line connected to a selected memory cell among the plurality of memory cells; and
   a plurality of data latches configured to temporarily store data to be stored in the selected memory cell,
   wherein any one data latch among the plurality of data latches stores result information for a verify operation of the first to n-th program states until a verify operation for a set program state of the first to n-th program states passes, and
   wherein the sensing latch stores the result information for the verify operation of the first to n-th program states after the verify operation for the set program state passes.

2. The memory device of claim 1, wherein the plurality of data latches store subsequent data to be stored in a subsequent memory cell to be selected after selection of the selected memory cell after the verify operation for the set program state passes.

3. The memory device of claim 2, wherein the subsequent data is programmed in the subsequent memory cell when a verify operation for the n-th program state passes.

4. The memory device of claim 1, wherein the set program state is an (n−1)-th program state among the first to n-th program states.

5. The memory device of claim 1, further comprising:
   a pre-verify latch configured to store pre-verify information indicating whether to apply a pre-verify voltage less than a main verify voltage to a selected word line connected to the selected memory cell before applying the main verify voltage to the selected word line connected to the selected memory cell during the verify operation of the first to n-th program states.

6. The memory device of claim 1, wherein one data latch among the plurality of data latches is a cache latch that stores data received from a memory controller controlling the memory device.

7. The memory device of claim 1, further comprising:
a program state determiner configured to determine whether a threshold voltage of the selected memory cell has reached the set program state;
a page buffer controller configured to transfer data between the plurality of data latches; and
a latch inverter configured to invert the data stored in the sensing latch.

8. The memory device of claim 7, wherein the page buffer controller transfers data stored in one data latch among the plurality of data latches that stores data received from a memory controller controlling the memory device to another data latch among the plurality of data latches when the verify operation for the set program state passes.

9. The memory device of claim 8, wherein the latch inverter inverts the result information for the verify operation of the first to n-th program states, which the sensing latch receives from the plurality of data latches, in a program loop after the threshold voltage of the selected memory cell reaches the set program state.

10. The memory device of claim 9,
wherein the program loop includes a pre-charge period for pre-charging the bit line connected to the selected memory cell and a verify period for sensing a potential of the bit line, and
wherein the latch inverter inverts the data stored in the sensing latch after the pre-charge period, and inverts the data stored in the sensing latch after the verify period.

11. The memory device of claim 10, wherein the sensing latch stores pre-charge data for determining a potential to which the bit line connected to the selected memory cell is to be pre-charged in the pre-charge period.

12. A memory device comprising:
a plurality of memory cells;
a peripheral circuit configured to perform a program operation for the plurality of memory cells to have threshold voltages corresponding to one of first to n-th program states according to data to be stored in the plurality of memory cells,
wherein the program operation is configured to perform a plurality of program loops,
wherein the plurality of program loops are configured to perform a program pulse operation and a verify operation, respectively, and
wherein the peripheral circuit comprises:
a sensing latch configured to store sensing data sensed from a bit line connected to a selected memory cell among the plurality of memory cells; and
data latches configured to temporarily store program data to be stored in the selected memory cell among the plurality of memory cells; and
control logic configured to control the peripheral circuit to store result information for a verify operation of first to set program states in any one data latch among the data latches, until a verify operation for the set program state of the first to n-th program states passes, and store result information for a verify operation of the first to n-th program states performed after the verify operation for the set program state passes in the sensing latch.

13. The memory device of claim 12, wherein when the threshold voltage of the selected memory cell reaches the set program state, the control logic transfers the result information from the data latch in which the result information was stored to the sensing latch and inputs subsequent data to be stored in a subsequent memory cell to be selected after selection of the selected memory cell to a selected data latch among the data latches.

14. The memory device of claim 13, wherein the control logic controls the sensing latch and the data latches so that the subsequent data is programmed in the subsequent memory cell when a verify operation for the n-th program state passes.

15. A method of operating a memory device comprising a sensing latch configured to store data sensed from a bit line connected to a selected memory cell among a plurality of memory cells configured to have threshold voltages corresponding to one of first to n-th program states, respectively by a program operation, where n is a natural number greater than 1, and a plurality of data latches configured to temporarily store data to be stored in the selected memory cell, the method comprising:
storing result information for a verify operation for the first to n-th program states in any one data latch among the plurality of data latches;
determining whether a verify operation for a set program state among the first to n-th program states passes; and
storing the result information for the verify operation for the first to n-th program states after the verify operation for the set program state passes in the sensing latch based on the determination result.

16. The method of claim 15, wherein storing of the result information for the verify operation for the first to n-th program states in the sensing latch comprises:
storing the result information in the sensing latch; and
inputting subsequent data to be stored in a subsequent memory cell to be selected after selection of the selected memory cell in the data latch in which the result information was stored.

17. The method of claim 16, further comprising:
programming the subsequent data to the subsequent memory cell after a verify operation for the n-th program state passes.

18. The method of claim 15, wherein the set program state is an (n−1)-th program state among the first to n-th program states.

19. The method of claim 15, further comprising:
inverting the data stored in the sensing latch after the verify operation for the set program state passes.

20. The method of claim 19, wherein inverting of the data stored in the sensing latch comprises:
inverting the data stored in the sensing latch after a pre-charge period for pre-charging the bit line connected to the selected memory cell; and
inverting the data stored in the sensing latch after a verify period for sensing a potential of the bit line.

* * * * *